(12) United States Patent
Park et al.

(10) Patent No.: US 11,387,384 B2
(45) Date of Patent: Jul. 12, 2022

(54) LED TRANSFERRING METHOD AND DISPLAY MODULE MANUFACTURED BY THE SAME

(71) Applicant: SAMSUNG ELECTRONICS CO., LTD., Suwon-si (KR)

(72) Inventors: Sangmoo Park, Suwon-si (KR); Minsub Oh, Seoul (KR); Doyoung Kwag, Suwon-si (KR); Byungchul Kim, Suwon-si (KR); Eunhye Kim, Suwon-si (KR); Dongyeob Lee, Suwon-si (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 78 days.

(21) Appl. No.: 16/850,645

(22) Filed: Apr. 16, 2020

(65) Prior Publication Data
US 2020/0335659 A1  Oct. 22, 2020

(30) Foreign Application Priority Data

Apr. 16, 2019 (KR) .................. 10-2019-0044548
Oct. 23, 2019 (KR) .................. 10-2019-0132193

(51) Int. Cl.
*H01L 33/00* (2010.01)
*H01L 33/24* (2010.01)
*H01L 25/075* (2006.01)

(52) U.S. Cl.
CPC ...... *H01L 33/0095* (2013.01); *H01L 25/0753* (2013.01); *H01L 33/24* (2013.01)

(58) Field of Classification Search
CPC .. H01L 33/0095; H01L 33/24; H01L 25/0753
USPC ............................................. 257/79
See application file for complete search history.

(56) References Cited

U.S. PATENT DOCUMENTS

| 6,961,993 B2 | 11/2005 | Oohata |
| 8,476,826 B2 | 7/2013 | Oohata et al. |
| 9,373,274 B2 | 6/2016 | Okuyama |
| 10,755,958 B2 | 8/2020 | Arai |

(Continued)

FOREIGN PATENT DOCUMENTS

| CN | 110034224 A | 7/2019 |
| JP | 2008-60608 A | 3/2008 |

(Continued)

OTHER PUBLICATIONS

International Search Report (PCT/ISA/210) dated Aug. 21, 2020 issued by the International Searching Authority in counterpart International Application No. PCT/KR2020/005063.

(Continued)

*Primary Examiner* — Igwe U Anya
(74) *Attorney, Agent, or Firm* — Sughrue Mion, PLLC

(57) ABSTRACT

A light-emitting diode (LED) transferring method is provided. The LED transferring method includes disposing a transfer substrate, on which a plurality of LEDs of different colors are sequentially arranged in at least one row or at least one column, between a target substrate and a laser oscillator, and simultaneously transferring the plurality of LEDs from the transfer substrate to predetermined points of the target substrate by radiating a laser beam toward the target substrate from the laser oscillator.

20 Claims, 36 Drawing Sheets

(56) References Cited

U.S. PATENT DOCUMENTS

| | | | |
|---|---|---|---|
| 10,804,425 B2 | 10/2020 | Moon et al. | |
| 2007/0103540 A1* | 5/2007 | Noh | B41J 2/4753 |
| | | | 347/238 |
| 2008/0017873 A1* | 1/2008 | Tomoda | H01L 24/90 |
| | | | 257/90 |
| 2009/0258167 A1* | 10/2009 | Tanaka | C23C 14/28 |
| | | | 427/595 |
| 2010/0143610 A1* | 6/2010 | Tanaka | H01L 51/0013 |
| | | | 427/595 |
| 2016/0190105 A1* | 6/2016 | Rhee | H01L 33/50 |
| | | | 257/76 |
| 2018/0068995 A1* | 3/2018 | Kajiyama | H01L 25/50 |
| 2019/0157502 A1 | 5/2019 | Moon et al. | |
| 2019/0221466 A1 | 7/2019 | Arai | |
| 2019/0334056 A1* | 10/2019 | Schlemper | H01L 21/7806 |
| 2021/0272824 A1 | 9/2021 | An et al. | |

FOREIGN PATENT DOCUMENTS

| | | |
|---|---|---|
| JP | 2010-087064 A | 4/2010 |
| JP | 4491948 B2 | 6/2010 |
| JP | 2010-251360 A | 11/2010 |
| JP | 5135865 B2 | 2/2013 |
| JP | 5196262 B2 | 5/2013 |
| JP | 2018-60993 A | 4/2018 |
| KR | 10-2017-0104086 A | 9/2017 |
| KR | 10-1900925 B1 | 9/2018 |
| KR | 10-2019-0009083 A | 1/2019 |
| KR | 10-2019-0014430 A | 2/2019 |
| KR | 10-1953797 B1 | 3/2019 |
| KR | 10-1972480 B1 | 4/2019 |
| WO | 2018/082845 A1 | 5/2018 |

OTHER PUBLICATIONS

International Written Opinion (PCT/ISA/237) dated Aug. 21, 2020 issued by the International Searching Authority in counterpart International Application No. PCT/KR2020/005063.

Communication dated Nov. 29, 2021 issued by the European Patent Office in European Application No. 20791375.7.

\* cited by examiner

FIG. 8
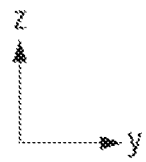
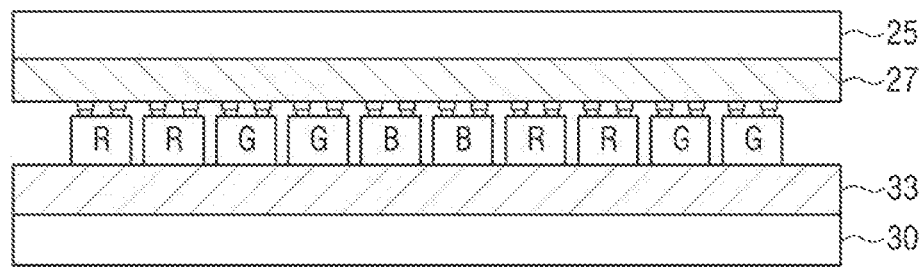

FIG. 9
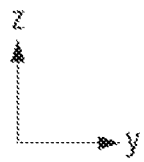
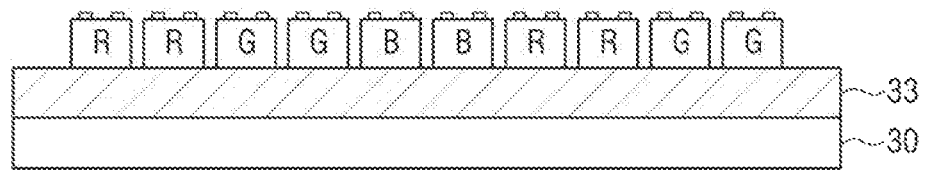

LED TRANSFERRING METHOD AND DISPLAY MODULE MANUFACTURED BY THE SAME

CROSS-REFERENCE TO RELATED APPLICATION(S)

This application is based on and claims priority under 35 U.S.C. § 119 to Korean Patent Application No. 10-2019-0044548, filed on Apr. 16, 2019, and Korean Patent Application No. 10-2019-0132193, filed on Oct. 23, 2019, in the Korean Intellectual Property Office, the disclosures of which are herein incorporated by reference in their entireties.

BACKGROUND

1. Field

The disclosure relates to a light-emitting diode (LED) transferring method and a display module including a plurality of LEDs manufactured by the same.

2. Description of Related Art

A micro-luminescent diode (microLED, mLED, or μLED) display panel is a flat display panel that includes a plurality of inorganic LEDs that are each smaller than 100 micrometers.

A microLED display panel provides improved contrast, response time, and energy efficiency as compared to a liquid crystal panel that requires a back light.

Although both organic LEDs (OLEDs) and microLEDs have high energy efficiency, microLEDs are brighter, have improved luminous efficiency, and have a longer lifespan than as compared to OLEDs.

An LED is a subminiature inorganic light-emitting material that emits light without a color filter and a backlight. A plurality of LEDs are manufactured by growing in a chip form on a wafer (growth substrate) through an epitaxial process. An LED that is manufactured in this way may be transferred onto a target substrate to constitute a display module.

However, the plurality of LEDs grown on the wafer have a difference in performance (e.g., color, brightness, and the like) between the respective regions caused by manufacturing tolerances, technical limitations in the manufacturing process, and the like. That is, LEDs formed in regions located away from a particular region of the wafer (e.g., a central portion of the wafer) may exhibit reduced performance.

As described above, the LEDs may be transferred onto the target substrate in an arrangement state in which the performance of the LEDs for each region on the wafer is different. Accordingly, the plurality of LEDs disposed on the target substrate have different performances between the respective regions. Due to these differences in performance, a display module manufactured using the target substrate has a problem in that luminance or color is not uniform over the entire region.

Red LEDs emitting red (R) light, green LEDs emitting green (G) light, and blue LEDs emitting blue (B) light are formed on different wafers, respectively. Accordingly, the LEDs may be sequentially transferred onto the target substrate for each color from respective wafers on which only red LEDs are formed, a wafer on which only green LEDs are formed, and a wafer on which only blue LEDs are formed. However, because a process of moving each wafer to a transfer position for each color to perform the transfer and then replacing each wafer with another wafer needs to be performed, there is a problem in that an LED transfer time is increased. As a result, the total manufacturing time of the display module is increased.

SUMMARY

According to an aspect of the disclosure, a light-emitting diode (LED) transferring method includes disposing a transfer substrate, on which a plurality of LEDs of different colors are sequentially arranged in at least one row or at least one column, between a target substrate and a laser oscillator; and simultaneously transferring the plurality of LEDs from the transfer substrate to predetermined points of the target substrate by radiating a laser beam toward the target substrate from the laser oscillator. The plurality of LEDs are formed as a group and are simultaneously transferred onto the target substrate.

A plurality of groups, including the group, are simultaneously transferred onto the target substrate at predetermined intervals.

The group includes a red LED, a green LED, and a blue LED.

The group further includes a white LED.

The method includes moving the transfer substrate by a first movement distance; moving the target substrate by a second movement distance different from the first movement distance; and simultaneously transferring another plurality of LEDs of different colors from the transfer substrate to the target substrate.

The method includes bonding the plurality of LEDs to the target substrate by pressing the plurality of LEDs with a pressing member.

The pressing member is configured to press the plurality of LEDs using a buffer layer formed on a surface facing the plurality of LEDs.

The method includes bonding a relay substrate by pressing the relay substrate toward the target substrate.

The method includes bonding the plurality of LEDs to the target substrate using a thermal bonding method.

The thermal bonding method comprises heating the target substrate with a heater, or heating the target substrate with an infrared laser.

According to an aspect of the disclosure, a display module includes a glass substrate; and a plurality of light-emitting diodes (LEDs) of different colors. The display module is manufactured by disposing a transfer substrate, on which the plurality of LEDs are sequentially arranged in at least a row or at least a column, between the glass substrate and a laser oscillator; and simultaneously transferring the plurality of LEDs from the transfer substrate to predetermined points of the glass substrate by radiating a laser beam toward the target substrate from the laser oscillator.

The plurality of LEDs are formed as a group.

A plurality of groups, including the group, are transferred onto the glass substrate at predetermined intervals.

The group includes a red LED, a green LED, and a blue LED.

The group further includes at least an additional LED different in color from a red LED, a green LED, and a blue LED.

The additional LED is a white LED.

The red LED, the green LED, and the blue LED are sequentially arranged in the row or the column.

The red LED, the green LED, the blue LED, the white LED are sequentially arranged in the row or the column.

According to an aspect of the disclosure, a non-transitory computer readable medium includes a program for executing a light-emitting diode (LED) transferring method. The LED transferring method includes disposing a transfer substrate, on which a plurality of LEDs of different colors are sequentially arranged in at least one row or at least one column, between a target substrate and a laser oscillator; and simultaneously transferring the plurality of LEDs from the transfer substrate to predetermined points of the target substrate by radiating a laser beam toward the target substrate from the laser oscillator.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 7 to 9 are diagrams sequentially illustrating a process of transporting a plurality of LEDs from a temporary substrate to a relay substrate according to an embodiment;

DETAILED DESCRIPTION

Figure 1:
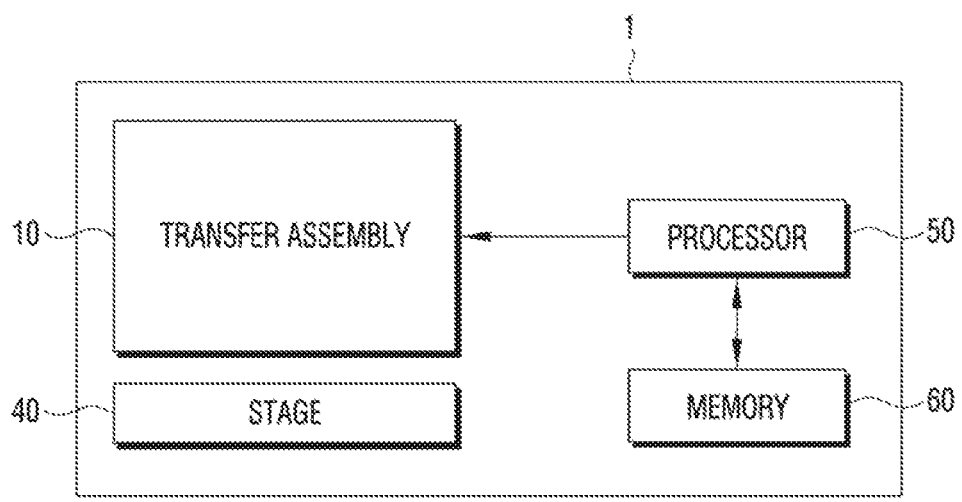
FIG. 1 is a block diagram schematically illustrating an LED transferring apparatus according to an embodiment.

In order to fully describe the configuration and effects of the disclosure, embodiments of the disclosure will be described with reference to the accompanying drawings. However, the disclosure is not limited to embodiments disclosed below, and may be implemented in various forms and variously modified. However, the description of the embodiments is provided to make the disclosure complete, and to fully inform those skilled in the art as to the scope of the disclosure. In the accompanying drawings, for convenience of description, the size of the components is illustrated to be different than the actual size, and the ratio of each component may be exaggerated or reduced.

Terms such as "first," "second," etc., may be used to describe various components, but the components should not be limited by the terms. The terms may be used for the purpose of distinguishing one component from other components. For example, without departing from the scope of the disclosure, a first component may be referred to as a second component, and similarly, the second component may also be referred to as the first component.

Singular expressions of terms include plural expressions of the terms unless the context clearly indicates otherwise. Terms such as "comprises," "having," etc., may indicate the existence of the recited features, numbers, steps, operations, components, parts, or combinations thereof, but do not preclude the existence of one or more other features, numbers, steps, operations, components, parts, or combinations thereof.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

Unless otherwise defined, terms used to describe the embodiments of the disclosure may be interpreted consistently with meanings commonly known to those skilled in the art.

A display module manufactured according to embodiments of the disclosure may include a substrate having a thin-film transistor (TFT) layer formed one surface thereof, a plurality of LEDs arranged on the TFT layer, and a wiring electrically connecting circuits disposed on a rear surface of the substrate. Here, the substrate may correspond to a target substrate, which will be described later, may be any one of a glass substrate, a flexible substrate, and a plastic substrate, and may be referred to as a "backplane."

A display module according to embodiments of the disclosure may include a rear substrate which is electrically connected to the rear surface of the substrate through a flexible printed circuit (FPC). Here, the rear substrate may be formed in a form of a thin film or a form of a thin glass having a thickness of several tens of micrometers (μm) (e.g., 50 μm or less). In the case in which the rear substrate is formed of the form of a thin film, the rear substrate may be formed of a plastic material, for example, any one of polyimide (PI), polyethylene terephthalate (PET), polyethersulfone (PES), polyethylene naphtalate (PEN), and polycabonate (PC).

The substrate according to an embodiment may have a side wiring formed on an edge portion, and the side wiring may electrically connect a first connection pad formed on an edge portion of a front surface of the substrate and a second connection pad formed on the rear surface of the substrate. To this end, the side wiring may be formed along the front surface, a side end surface, and the rear surface of the substrate, and may have one end electrically connected to the first connection pad and the other end electrically connected to the second connection pad. At this time, because the side wiring is partially formed on the side end surface of the substrate, the side wiring may protrude more than a side end surface of the TFT substrate by a thickness of the side wiring. In this case, the rear substrate may be electrically connected to the second connection pad through the FPC. A driver integrated circuit (IC) mounted on the rear surface of the TFT substrate may be directly connected to the second connection pad or indirectly connected to the second connection pad through a separate wiring.

In addition, a display module according to an embodiment may be applied to a wearable device, a portable device, a handheld device, and an electronic product or an electronic device having various displays in a single unit, and may be applied to small display devices such as monitors for personal computers and televisions (TVs), and large display devices such as digital signage and electronic displays through a plurality of assembly arrangements.

An LED according to an embodiment may be formed of an inorganic light-emitting material, and may be a semiconductor chip capable of emitting light by itself when power is supplied.

In addition, the LED has a fast reaction speed, low power, and high luminance, and thus may be a microLED that has been spotlighted as a light-emitting element of a next-generation display. Such a microLED has a higher efficiency of converting electricity to photons than a conventional liquid crystal display (LCD) or organic light-emitting diode (OLED). That is, the microLED has a higher "brightness per watt" than a conventional LCD or OLED display. Accordingly, the micro LED may emit the same brightness while consuming about half the energy of the conventional LED (e.g., an LEG having an area greater than 100 µm×100 µm) or OLED. In addition, the microLED may implement high resolution, excellent color, contrast, and brightness, thereby accurately expressing a wide range of colors, and implementing a clear screen even in outdoor environments exposed to direct sunlight. In addition, because the microLED is resistant to burn in, and has low heat generation, a long product lifespan is provided without deformation.

In addition, according to an embodiment, when LEDs of different colors (e.g., R, G, and B LEDs) are primarily transferred onto a relay substrate at the same time, and a plurality of LEDs are then secondarily transferred from the relay substrate onto a target substrate for each unit (e.g., each of R, G, and B units), various transferring methods (e.g., a laser transferring method, a stamp transferring method, a roller transferring method, and an electrostatic transferring method) may be applied. Hereinafter, the laser transferring method among the transferring methods described in the disclosure will be described as an example.

The display module according to an embodiment may be applied to a wearable device, a portable device, a handheld device, etc., as a single unit, and to electronic products that have various displays. In addition, the display module may be a matrix type applicable to a display device such as a personal computer monitor, a high-resolution TV, a signage, and an electronic display through a plurality of assembly arrangements.

An embodiment may provide an LED transferring method capable of significantly reducing a process time by simultaneously transferring LEDs of different colors onto a target substrate.

An embodiment may also provide a display module including LEDs capable of improving uniformity of performance by uniformly disposing a plurality of LEDs having different performance on a target substrate.

Hereinafter, a structure of an LED transferring apparatus according to an embodiment will be described with reference to FIG. 1.

FIG. 1 is a block diagram schematically illustrating an LED transferring apparatus according to an embodiment.

Referring to FIG. 1, the LED transferring apparatus may include a transfer assembly 10 for transferring a plurality of red, green, and blue LEDs arranged in a predetermined arrangement on a relay substrate to a target substrate, a stage 40 disposed adjacent to the transfer assembly 10 to move the target substrate in X, Y, and Z axis directions, a memory 60 in which characteristic information of each of the plurality of LEDs is stored, and a processor 50 for controlling the transfer assembly 10 and the stage 40 to determine a position where the plurality of LEDs are to be respectively placed on the relay substrate based on the stored characteristic information, and to transfer the plurality of LEDs to the determined placement position.

The transfer assembly 10 may simultaneously transfer predetermined red, green, and blue LEDs from the relay substrate on which a plurality of red, green, and blue LEDs are arranged to the target substrate through a laser lift off (LLO) method, or a pick and place method.

Figure 12:
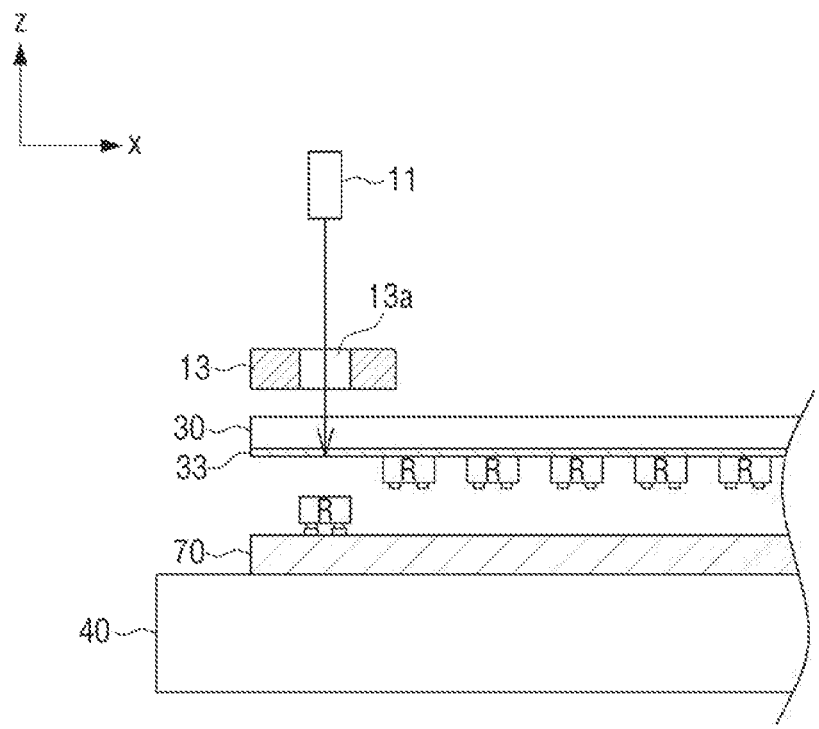

In order to perform a transfer process using the LLO method, the transfer assembly 10 may include a laser oscillator 11 (as shown in FIG. 12) for radiating a laser beam toward the relay substrate 30 (as shown in FIG. 12), a mask 13 for limiting a radiation position (or range) of the laser beam so that the predetermined LED is selectively irradiated with the laser beam radiated from the laser oscillator, and a stage for the relay substrate 30 that may move the relay substrate 30 in the X-axis, Y-axis, and Z-axis directions, and rotate the relay substrate 30 around the Z-axis.

Figure 15:
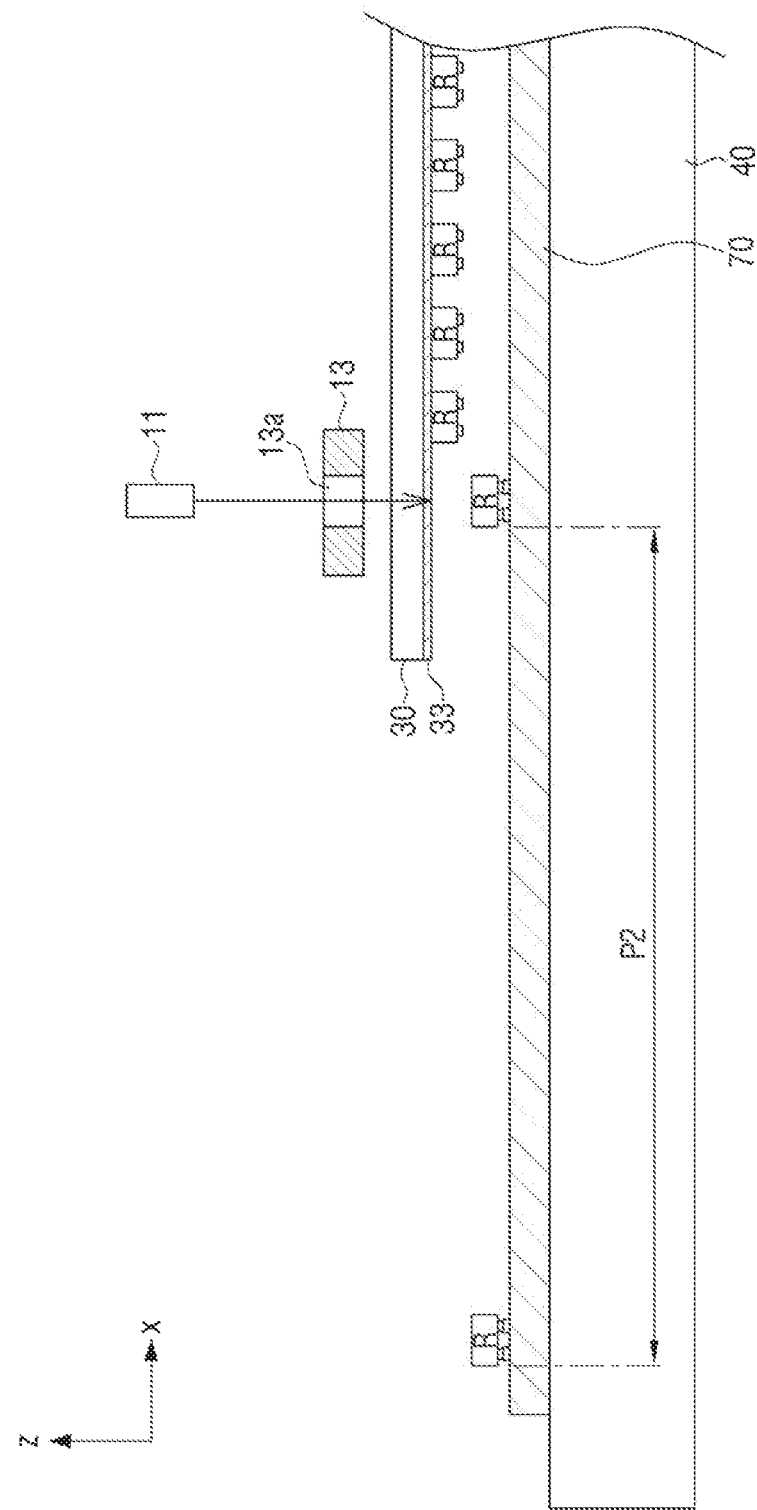

In this case, the mask 13 is disposed between the laser oscillator 11 and the relay substrate 30. The mask 13 may include a plurality of openings 13a (see FIG. 12) patterned in consideration of the positions of the plurality of LEDs arranged on the relay substrate 30. Although the mask 13 illustrated in FIG. 12 is illustrated as having only one opening 13a formed therein, the mask 13 has a plurality of openings so that a plurality of predetermined red, green, and blue LEDs may be simultaneously transferred from the relay substrate 30 as illustrated in FIG. 15.

The plurality of openings 13a may each include a shape capable of passing the laser beam to drop the plurality of LEDs on the relay substrate 30.

In addition, the plurality of openings 13a may include set formation positions in consideration of a pitch (P1, see FIG. 11) between the plurality of LEDs arranged on the relay substrate 30, and a pitch (P2, see FIG. 15) between the plurality of LEDs transferred onto the target substrate 70 together.

In order to perform a transfer process using the pick and place method, the transfer assembly 10 may include a picker for picking the predetermined LEDs from the relay substrate and placing the predetermined LEDs on the target substrate, and a stage for the relay substrate that may move the relay substrate in the X-axis, Y-axis, and Z-axis directions, and rotate the relay substrate around the Z-axis In this case, the picker may pick up and transfer the plurality of LEDs using various methods, such as an adhesive method, a vacuum method, an electrostatic method, a hybrid method, or the like.

Figure 11:
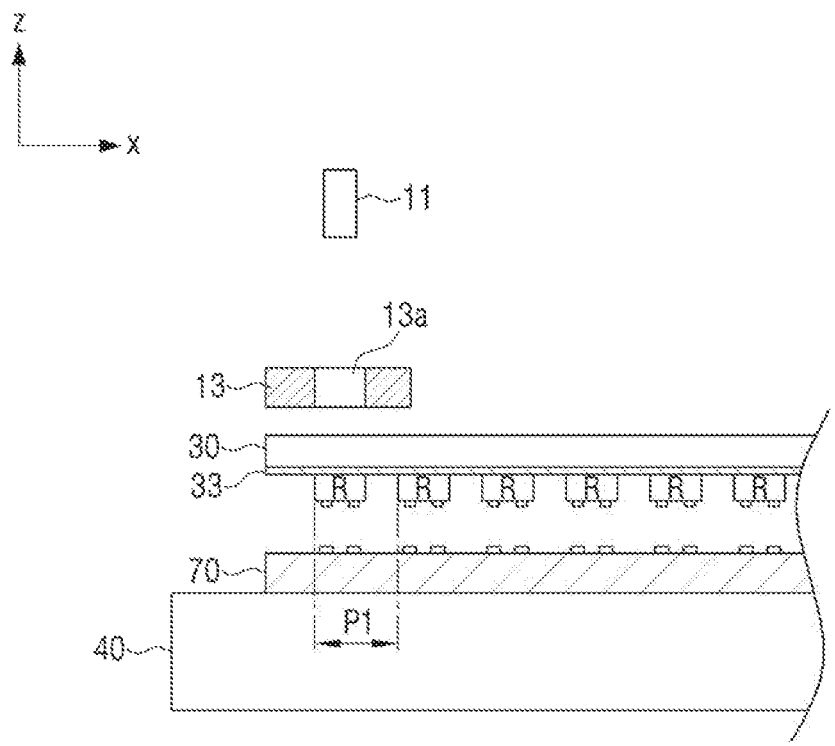
FIGS. 11 to 16 are diagrams sequentially illustrating a process of transferring a plurality of LEDs from a relay substrate to a target substrate according to an embodiment.

The stage 40 may clamp the target substrate 70 (as shown in FIG. 11) detachably to an upper surface of the stage 40, and may move in the X-axis, Y-axis, and Z-axis directions while the target substrate 70 is clamped, and rotate around the Z-axis.

The LED substrate according to an embodiment refers to a substrate manufactured to transfer the LEDs onto the target substrate 70. Therefore, in the disclosure, the LED substrate may be referred to as a "transfer wafer" or "relay substrate" manufactured in a state capable of transferring the LEDs onto the target substrate 70.

Figure 3:
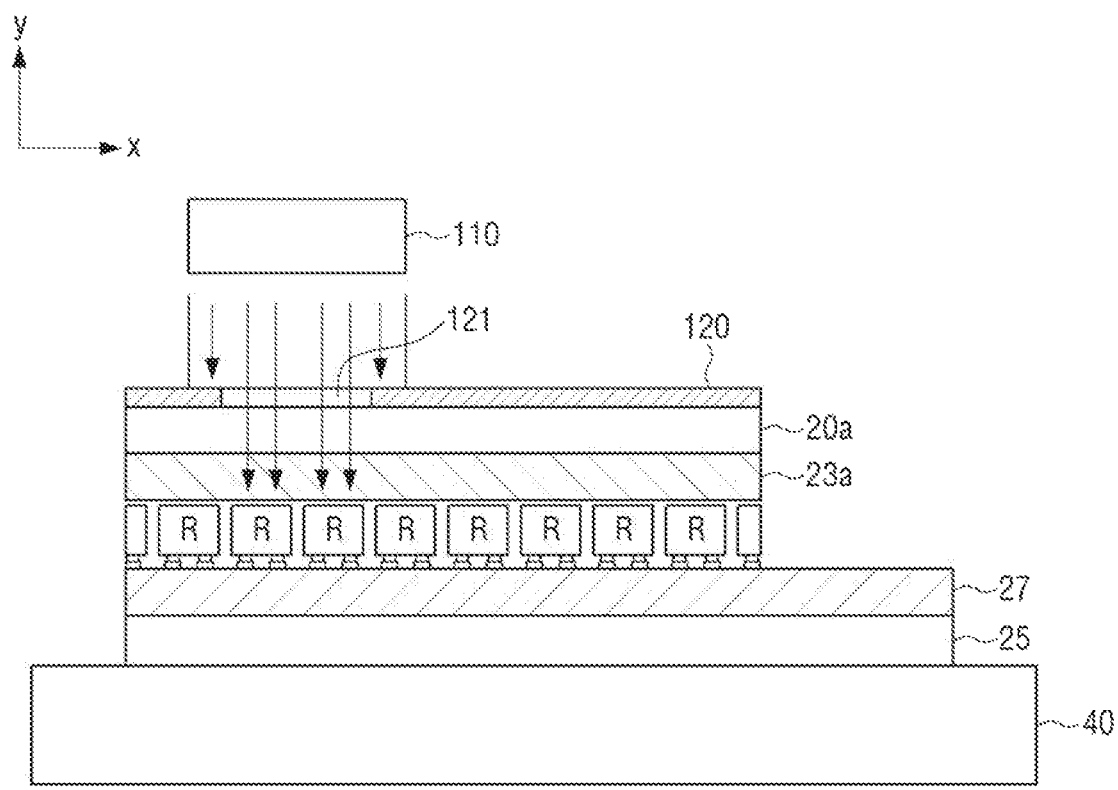
FIGS. 3 to 6 are diagrams sequentially illustrating a process of transporting a plurality of LEDs from a plurality of growth substrates to a temporary substrate according to an embodiment.
Figure 5:
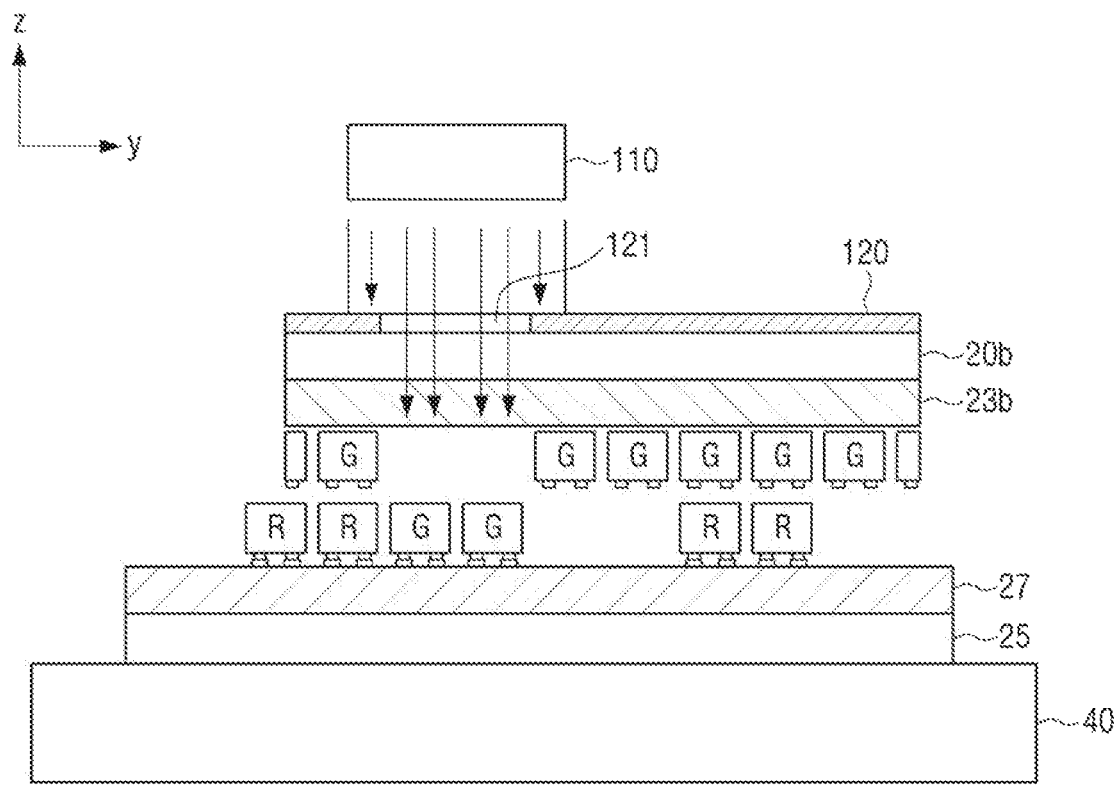
Figure 6:
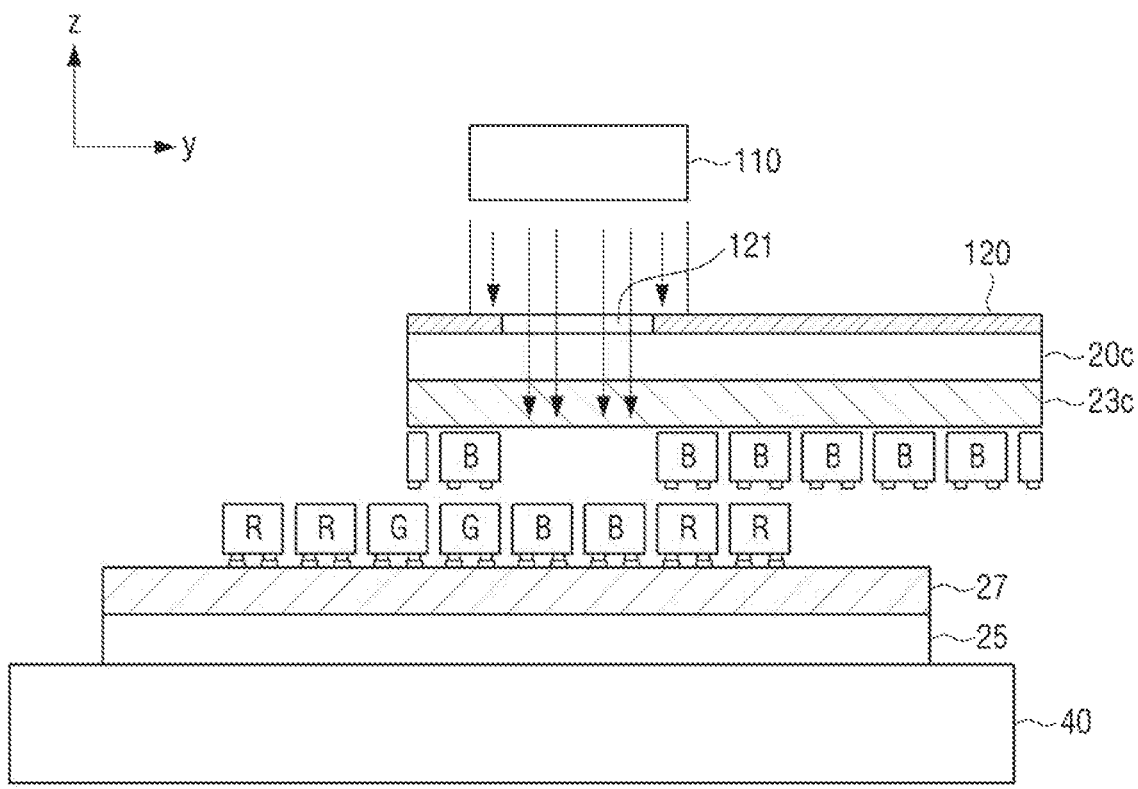

On first to third growth substrates 20a, 20b, and 20c, LEDs for each emission color (R, G, and B) may be formed. That is, the first growth substrate 20a may be a substrate on which only the red LEDs are grown, the second growth substrate 20b may be a substrate on which only greens LED are grown, and the third growth substrate 20c may be a substrate on which only blue LEDs are grown. The first to third growth substrates 20a, 20b, and 20c are illustrated in FIGS. 3, 5, and 6, respectively.

Each of the growth substrates 20a, 20b, and 20c may be a transparent substrate made of sapphire, silicon, or transparent glass, and may be used in a process to which the LLO method is applied. In this case, the transparent glass may be formed of a material that may be applied to epitaxial growth for forming a chip stack, such as metal organic chemical vapor deposition (MOCVD) or molecular beam epitaxy (MBE).

In addition, each of the growth substrates 20a, 20b, and 20c forms a buffer layer formed of a material capable of alleviating strain caused by a difference in lattice constant and coefficient of thermal expansion between a GaN layer and the growth substrate on an upper surface thereof.

The buffer layer may be formed of GaN, AlN, AlGaN, or SiNx, which are high heat resistance materials, to enable GaN layer deposition through a MOCVD or MBE process.

The plurality of LEDs formed by epitaxial growth on each of the growth substrates 20a, 20b, and 20c may be transported to the relay substrate 30 (as shown in FIG. 9) via a temporary substrate 25 (as shown in FIG. 3).

The temporary substrate 25 may be a transparent substrate made of sapphire, silicon, or transparent glass, and may be used in a process to which the LLO method is applied. A buffer layer 27 (as shown in FIG. 3) may be formed on the temporary substrate 25 in a similar manner as the growth substrate 20.

The red LED, the green LED, and the blue LED grown by an epitaxial process on different first substrates 20a, 20b, and 20c, respectively, may be arranged on the temporary substrate 25 based on a data map created for each of the first substrates 20a, 20b, and 20c by considering a performance difference for each area of each of the first substrates 20a, 20b, and 20c. In this case, the plurality of red, green, and blue LEDs of each of the growth substrates 20a, 20b, and 20c may be transferred to the temporary substrate 25 by at least one row or at least one column for each color. In the case in which the plurality of LEDs are arranged by at least one row for each color, a pitch between the respective columns adjacent to each other may be set equally, and in the case in which the plurality of LEDs are arranged by at least one column for each color, a pitch between the respective columns adjacent to each other may be set equally. In an embodiment, the plurality of LEDs are arranged in two rows for each color.

As such, the plurality of LEDs arranged on the temporary substrate 25 are transported to the relay substrate 30 for transfer.

The temporary substrate 25 may be formed larger than a size of the growth substrate 20. Accordingly, the plurality of LEDs disposed on one growth substrate 20, and the plurality of LEDs disposed on the plurality of growth substrates 20 may be transported in the LLO method on one temporary substrate 25.

The relay substrate 30 may be formed in the same size as the temporary substrate 25. Accordingly, all the red, green, and blue LEDs transported from the plurality of growth substrates 20a, 20b, and 20c to the temporary substrate 25 may be simultaneously transported.

The plurality of LEDs transported from the temporary substrate 25 to the relay substrate 30 are attached to an adhesive layer 33 (as shown in FIG. 9) formed on the relay substrate 30. The adhesive layer 33 may be referred to as a "dynamic release layer" (DRL), and may be formed of a polyimide (PI) material to facilitate separation upon transfer to the target substrate 70 (as shown in FIG. 11) using the LLO method.

The relay substrate 30 may be a transparent substrate made of sapphire, silicon, or transparent glass, and may be used in a process to which the LLO method is applied.

Among the plurality of red, blue, and green LEDs transported to the relay substrate 30, predetermined red, blue, and green LEDs may be simultaneously transferred onto the target substrate 70 using the LLO method.

In the LED transferring method according to an embodiment, a transfer process time may be significantly shortened because an operation of replacing the LED substrate for each color in order to transfer the LEDs onto the target substrate from each wafer on which the LEDs for each color are arranged may be omitted.

In addition, as the relay substrate 30 is formed to be larger than each wafer, the plurality of LEDs may be simultaneously transferred onto the target substrate 70. In contrast, in a case in which the LEDs are transferred from each wafer to the target substrate 70, the transfer process is performed multiple times due to a size difference between the wafer and the target substrate. As a result, there is a high possibility of damage to the target substrate including a sensitive electronic element such as a thin-film transistor (TFT). Therefore, in the case of transferring the plurality of LEDs to the target substrate 70 using the relay substrate 30 according to an embodiment, a transfer speed and transfer efficiency may be improved, and transfer stability and reliability may be improved.

In addition, the relay substrate 30 may have a pattern for the plurality of LEDs to be disposed on the relay substrate 30. Here, the pattern may be a circuit including a wire for supplying a current to the plurality of LEDs transferred onto the relay substrate 30.

Accordingly, in the case in which the plurality of LEDs are transferred from the temporary substrate 25 onto the relay substrate 30, the operability and performance of the plurality of LEDs may be integrally checked on the relay substrate 30.

In this case, by removing LEDs having poor or lower performance than a predetermined performance, and disposing new LEDs at the removed LED positions, an embodiment provides the ability to correct the plurality of LEDs transferred onto the relay substrate 30.

The LED transferring apparatus 1 may include a memory 60 and a processor 50.

The memory 60 may be implemented by at least one of a flash memory type, a read-only memory (ROM), a random access memory (RAM), a hard disk type, a multimedia card micro type, or a card type memory (e.g., a secure digital (SD) or extreme digital (XD) memory)

In addition, the memory 60 may be electrically connected to the processor 50 to transmit and receive signals and information to and from the processor 50. Accordingly, the memory 60 may store characteristic information of the plurality of input or irradiated LEDs, and transmit the stored characteristic information stored to the processor 50.

The processor 50 controls an overall operation of the LED transferring apparatus 1. That is, the processor 50 may be electrically connected to the transfer assembly 10 and the stage 40 to control each component.

For example, the processor 50 may control the transfer assembly 10 and the stage 40 to transport the plurality of LEDs from the growth substrate 20 to the temporary substrate 25, and transport the plurality of LEDs from the temporary substrate 25 to the relay substrate 30. In addition, the processor 50 may control the transfer assembly 10 and the stage 40 to transport the plurality of LEDs arranged on the relay substrate 30 to the target substrate 70. The processor 50 may be a single processor configured to control the foregoing components, or may be a plurality of processors to control the foregoing components.

The processor 50 may include one or more of a central processing unit (CPU), a controller, an application processor (AP), a communication processor (CP), or an ARM processor.

In addition, the processor 50 may be electrically connected to the memory 60 to use characteristic information of the plurality of LEDs stored in the memory 60.

Hereinafter, a process of manufacturing the LED substrate (relay substrate) according to an embodiment will be sequentially described with reference to FIGS. 2 to 16.

Figure 2:
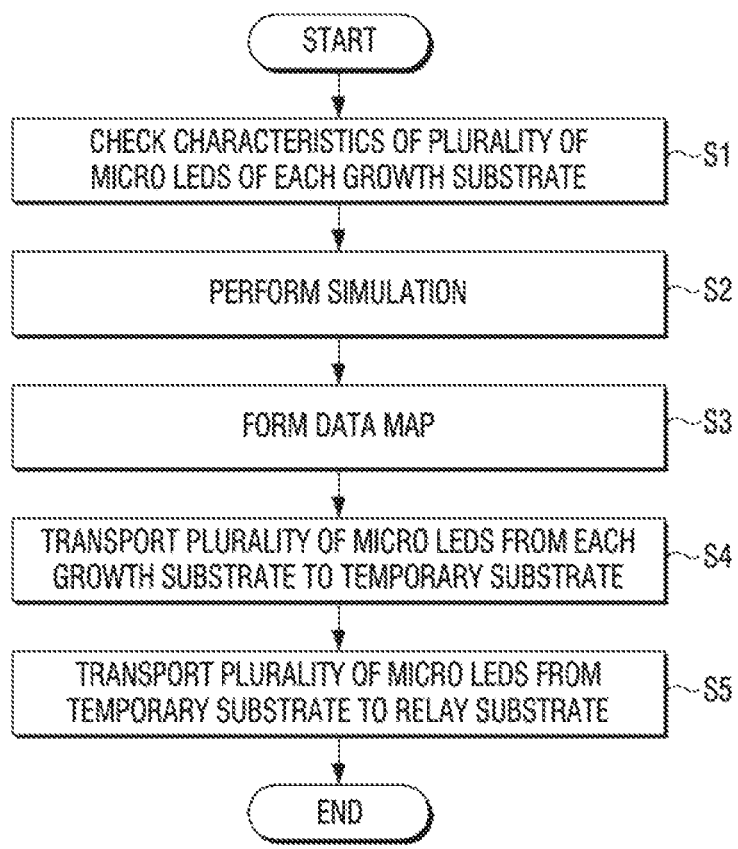
FIG. 2 is a flowchart illustrating a process of manufacturing an LED transferring substrate according to an embodiment.

FIG. 2 is a flowchart illustrating a process of manufacturing an LED transferring substrate (relay substrate) according to an embodiment, FIGS. 3 to 7 are diagrams illustrating a process of transporting the plurality of LEDs from the plurality of growth substrates to the temporary substrate according to an embodiment, and FIGS. 8 and 9 are diagrams illustrating a process of transporting the plurality of LEDs from the temporary substrate to the relay substrate according to an embodiment.

Referring to FIG. 2, the characteristics of the plurality of LEDs respectively formed on each of the growth substrates 20a, 20b, and 20c are checked (operation S1). The processor 50 analyzes the luminance and wavelength of each LED for each region of each of the growth substrates 20a, 20b, and 20c. The analyzed result may be stored in the memory 60.

If the characteristic check is complete, the processor 50 simulates a combination of each position for optimal arrangement considering uniformity, and the like, when arranging the plurality red, green, and blue LEDs from each of the growth substrates 20a, 20b, and 20c to the temporary substrate 25 based on the analysis result (operation S2).

If the optimal arrangement of the plurality of red, green, and blue LEDs to be disposed on the temporary substrate 25 is set through simulation, the processor 50 forms a data map based on the optimal arrangement (operation S3). The data map may be stored in the memory 60.

Subsequently, the LEDs of each of the growth substrates 20a, 20b, and 20c are sequentially transported to the temporary substrate 25 for each color based on the data map (operation S4).

Subsequently, the LEDs are transported from the temporary substrate 25 to the relay substrate 30 (operation S5).

Referring to FIG. 3, the temporary substrate 25 is fixed to the stage 40, and the first growth substrate 20a on which a plurality of red LEDs are formed is disposed on the temporary substrate 25. In this case, the first growth substrate 20a is disposed with the plurality of red LEDs facing the temporary substrate 25 and may be in contact with the temporary substrate 25.

The first growth substrate 20a may be fixed to a stage that is movable in the X and Y axis directions. In this case, the stage may move or stop the first growth substrate 20a on an X-Y plane to or at a desired position.

The first growth substrate 20a and the temporary substrate 25 may be set to an initial position for laser transfer. The initial position may be a starting point at which the plurality of red LEDs are transferred from the first growth substrate 20a to the temporary substrate 25 by a laser beam.

The mask 120 may be disposed on a top surface of the first growth substrate 20a so that a radiation region of the laser beam radiated from the laser oscillator 110 is limited to a desired point.

If the first growth substrate 20a and the temporary substrate 25 are set to the initial positions, the laser beam is radiated to a predetermined point toward the first growth substrate 20a. The laser beam heats the first growth substrate 20a and the buffer layer 23a through the opening 121 of the mask 120.

Accordingly, the plurality of red LEDs formed on the first growth substrate 20a is separated from the buffer layer 23a of the first growth substrate 20a, and is attached to the buffer layer 27 of the temporary substrate 25. In this case, each electrode of the plurality of red LEDs may be in contact with the buffer layer 27.

While transporting the plurality of red LEDs to the temporary substrate 25, the laser oscillator 110 and the mask 120 remain in a fixed state without changing position. In contrast, the first growth substrate 20a and the temporary substrate 25 are respectively moved to a predetermined position by the stage 40 and then stopped. The laser beam is radiated from the laser oscillator 110 to the first growth substrate 20a while the first growth substrate 20a and the temporary substrate 25 are stopped.

Figure 4:
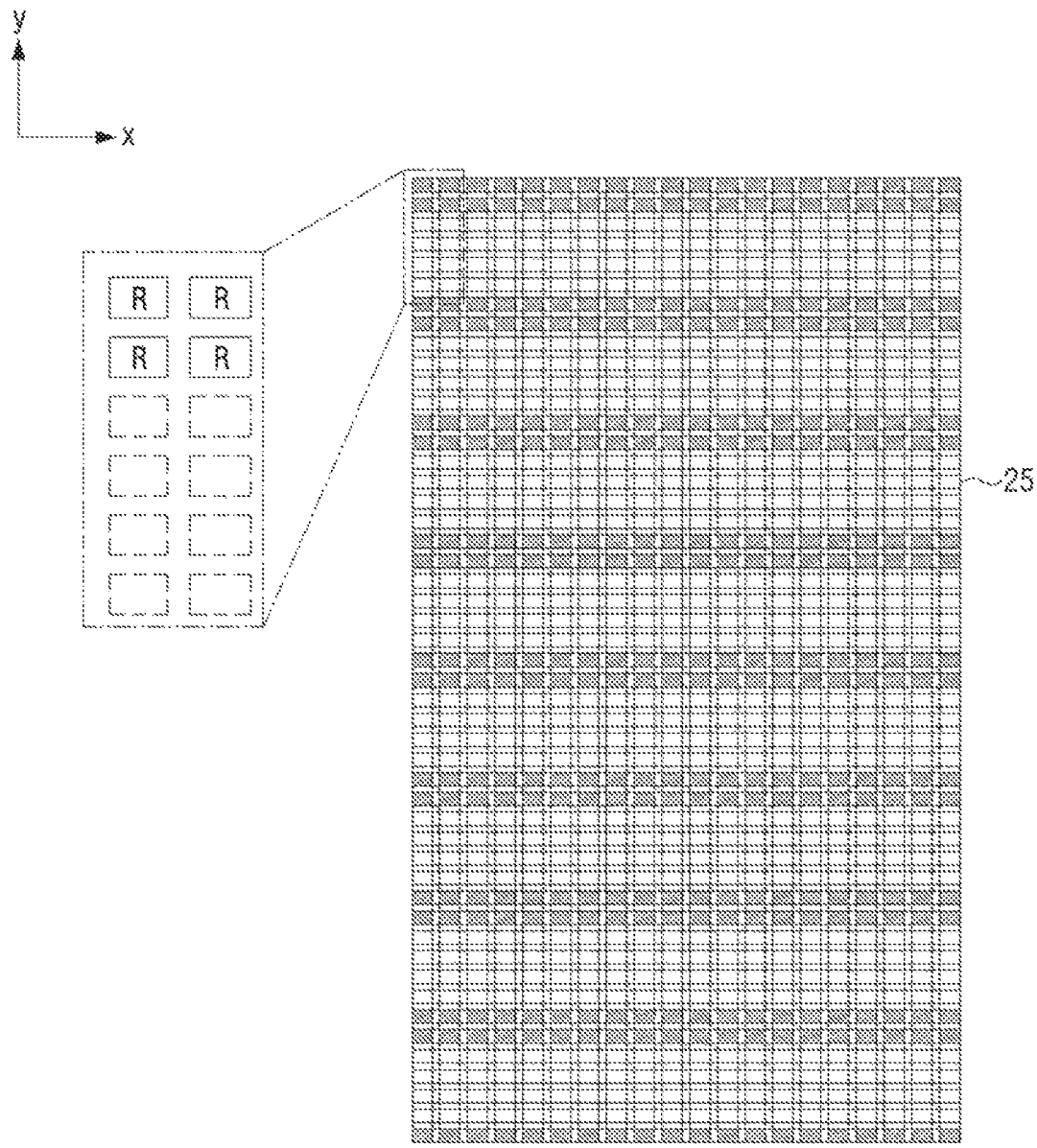

FIG. 4 illustrates a state in which the plurality of red LEDs are disposed from the first growth substrate 20a to an arrangement region of predetermined red LEDs on the temporary substrate 25 by repeatedly performing the laser transfer process.

The plurality of red LEDs arranged on the temporary substrate 25 may be disposed at regular intervals of two columns (regions in which two columns of green LEDs and two columns of blue LEDs will be disposed). In this case, the red LEDs are spaced from each other at the same pitch.

Referring to FIG. 5, the plurality of green LEDs of the second growth substrate 20b are arranged to face the temporary substrate 25. In this case, the second growth substrate 20b may be fixed to the stage in which the first growth substrate 20a was fixed in the previous operation.

The second growth substrate 20b may be disposed in a state where a predetermined gap is maintained upward from the temporary substrate 25 so that the number of green LEDs does not interfere with the red LEDs disposed on the temporary substrate 25 upon moving along the X-Y plane by the stage.

If the second growth substrate 20b and the temporary substrate 25 are set to the initial positions, the laser beam is radiated to a predetermined position toward the second growth substrate 20b. In this case, the mask 120 is disposed on a top surface of the second growth substrate 20b in the same manner as the first growth substrate 20b.

If a predetermined number of green LEDs are all transported from the second growth substrate 20b to the temporary substrate 25 through laser transfer, the third growth substrate 20c is arranged above the temporary substrate 25 as illustrated in FIG. 6.

In this case, the third growth substrate 20c is disposed to maintain a constant gap from the temporary substrate 25, like the second growth substrate 20b.

Subsequently, a predetermined number of blue LEDs are transported from the third growth substrate 20c to the temporary substrate 25 through laser transfer.

Figure 7:
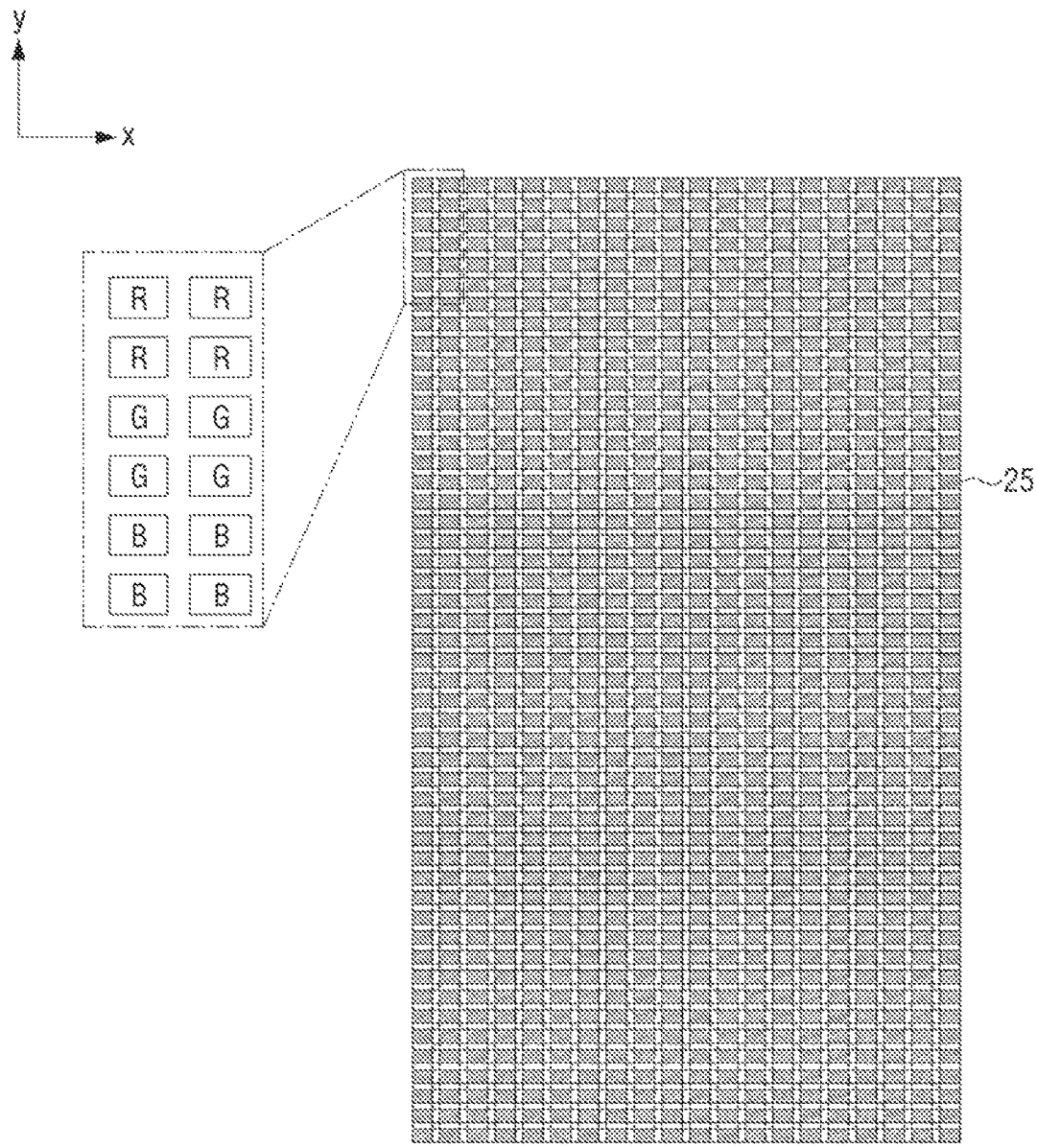

FIG. 7 illustrates a state in which the plurality of green and blue LEDs are disposed from the second and third growth substrates 20b and 20c to arrangement regions of predetermined green and blue LEDs on the temporary substrate 25 by repeatedly performing the laser transfer process.

The red, green, and blue LEDs are transported to be arranged on the temporary substrate 25 in the order of red, green, and blue LEDs, but are not limited thereto, and it is also possible to transport the red, green, and blue LEDs to the temporary substrate 25 so that the red, green, and blue LEDs are arranged in the order of the green, blue, and red LEDs, or to the temporary substrate 25 so that the red, green, and blue LEDs are arranged in the order of the blue, red, and green LEDs.

As such, if the plurality of red, green, and blue LEDs are all transported from the first to third growth substrates 20a, 20b, and 20c to the temporary substrate 25, the plurality of LEDs of the temporary substrate are disposed to face the relay substrate 30 as illustrated in FIG. 8.

In such a state, the plurality of LEDs of the temporary substrate 25 are in contact with the adhesive layer 33 of the relay substrate 30 and the laser beam is radiated toward the temporary substrate 25 while moving along the temporary substrate 25. As the buffer layer 27 of the temporary substrate 25 is removed by the laser beam, the temporary substrate 25 may be separated from the plurality of LEDs.

Referring to FIG. 9, the plurality of red, green, and blue LEDs are transported from the temporary substrate 25 to the relay substrate 30 and attached to the adhesive layer 33.

Next, a process of simultaneously transferring the red, green, and blue LEDs from the relay substrate 30 to the target substrate 70 will be described with reference to FIGS. 10 to 16.

Here, the target substrate 70 may have a thin-film transistor (TFT) layer formed on the front surface thereof, and may include a wiring electrically connecting a plurality of LEDs arranged on the TFT layer and circuits disposed on the rear side of the target substrate 70.

The target substrate 70 configured as described above may be subjected to a process in which the plurality of LEDs emitting different colors are simultaneously transferred to the TFT layer. The target substrate 70 subjected to such a transfer process may be referred to as a "display module."

In this case, simultaneously transferring the plurality of LEDs emitting different colors may mean that a plurality of groups are simultaneously transferred onto the target substrate 70 when the red, green, and blue LEDs are defined as a single group. In this case, the single group may further include a white LED.

In addition, one group is not limited to only the meaning described above, and may also mean that a plurality of first groups are simultaneously transferred onto the target substrate 70 or a plurality of second groups are simultaneously transferred onto the target substrate 70, when red and green LEDs are defined as one first group and blue and white LEDs are defined as one second group. In this case, the plurality of first groups may be simultaneously transferred onto the target substrate 70, and then the plurality of second groups may be simultaneously transferred onto the target substrate 70.

The transfer process is described as being performed using the LLO method as an example, but is not limited thereto, and the transfer process may be performed using the pick and place method (or stamp method).

Figure 10:
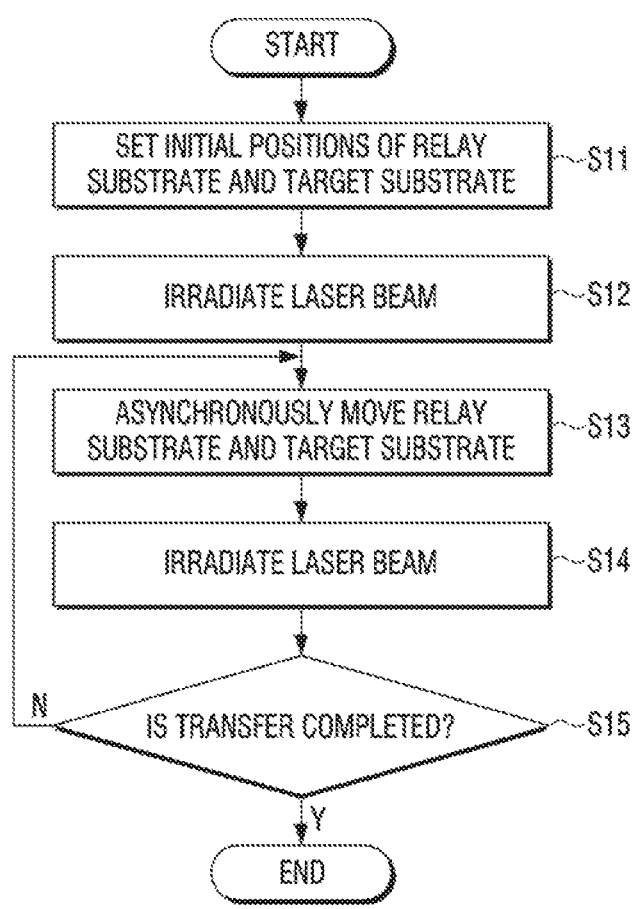
FIG. 10 is a flowchart illustrating a process of transferring the plurality of LEDs from a relay substrate to a target substrate according to an embodiment.

FIG. 10 is a flowchart illustrating a process of transferring the plurality of LEDs from the relay substrate 30 to the target substrate 70 according to an embodiment, and FIGS. 11 to 16 are diagrams sequentially illustrating a process of transferring the plurality of LEDs from the relay substrate 30 to the target substrate 70 according to an embodiment.

Referring to FIG. 11, the target substrate 70 is fixed to the stage 40 in a state in which a surface onto which the plurality of red, green, and blue LEDs are to be transferred is directed toward a laser oscillator 11.

The relay substrate 30 is disposed such that the plurality of red, green, and blue LEDs are directed toward the target substrate 70. The relay substrate 30 may be fixed to a stage, and the stage may move the relay substrate 30 to a desired point along the X-Y plane as the stage moves along the X and Y axes.

The mask 13 is disposed above the relay substrate 30 and is fixed together with the laser oscillator 11. The laser oscillator 11 used in the process of transferring the plurality of LEDs from the relay substrate 30 to the target substrate may be the same as the laser oscillator 110 described above.

In order to simultaneously transfer LEDs of different colors from the relay substrate 30 onto the target substrate 70, the relay substrate 30 and the target substrate 70 may be set to initial positions by respective stages (operation S11). The initial position may be a starting point at which a predetermined number of red, green, and blue LEDs are transferred onto the target substrate 70 in a first column of the relay substrate 30 by the laser beam.

Referring to FIG. 12, the laser beam is radiated to a predetermined point with respect to the relay substrate 30 from the laser oscillator 11 (operation S12). Accordingly, a plurality of predetermined red, green, and blue LEDs of the first column arranged on the relay substrate 30 are separated from the adhesive layer 33 of the relay substrate 30 and transferred onto the target substrate 70.

Figure 13:
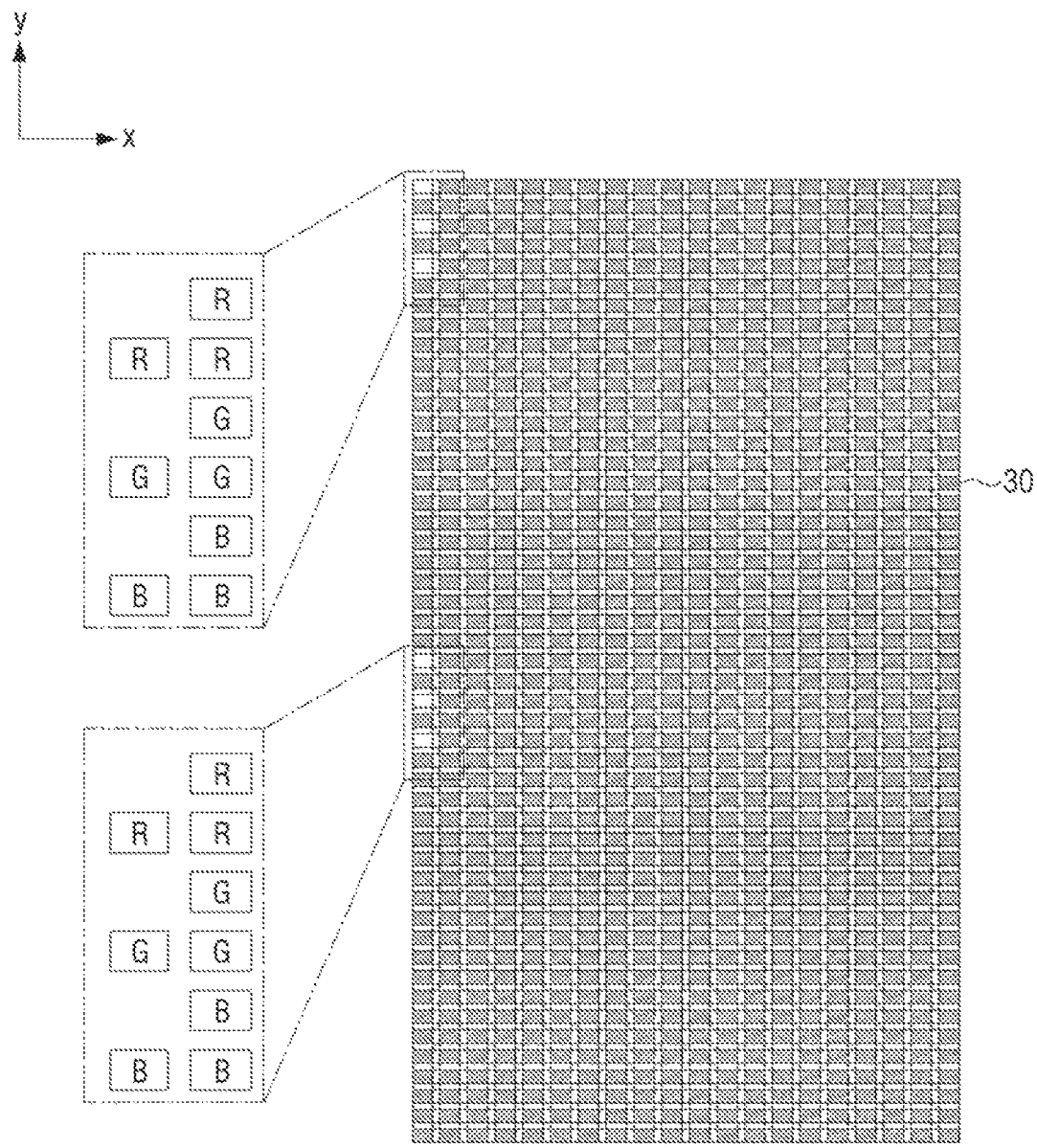

FIG. 13 illustrates the relay substrate 30 in a state in which the plurality of predetermined red, green, and blue LEDs of the first column are separated according to an embodiment.

As described above, as the plurality of predetermined red, green, and blue LEDs are simultaneously transferred from the relay substrate 30 onto the target substrate 70, the transfer process may be performed at a significantly faster speed than the related art in which the LEDs for each color are sequentially transferred from the wafers (or substrates) on which the LEDs for each color are formed to the target substrate.

Figure 14:
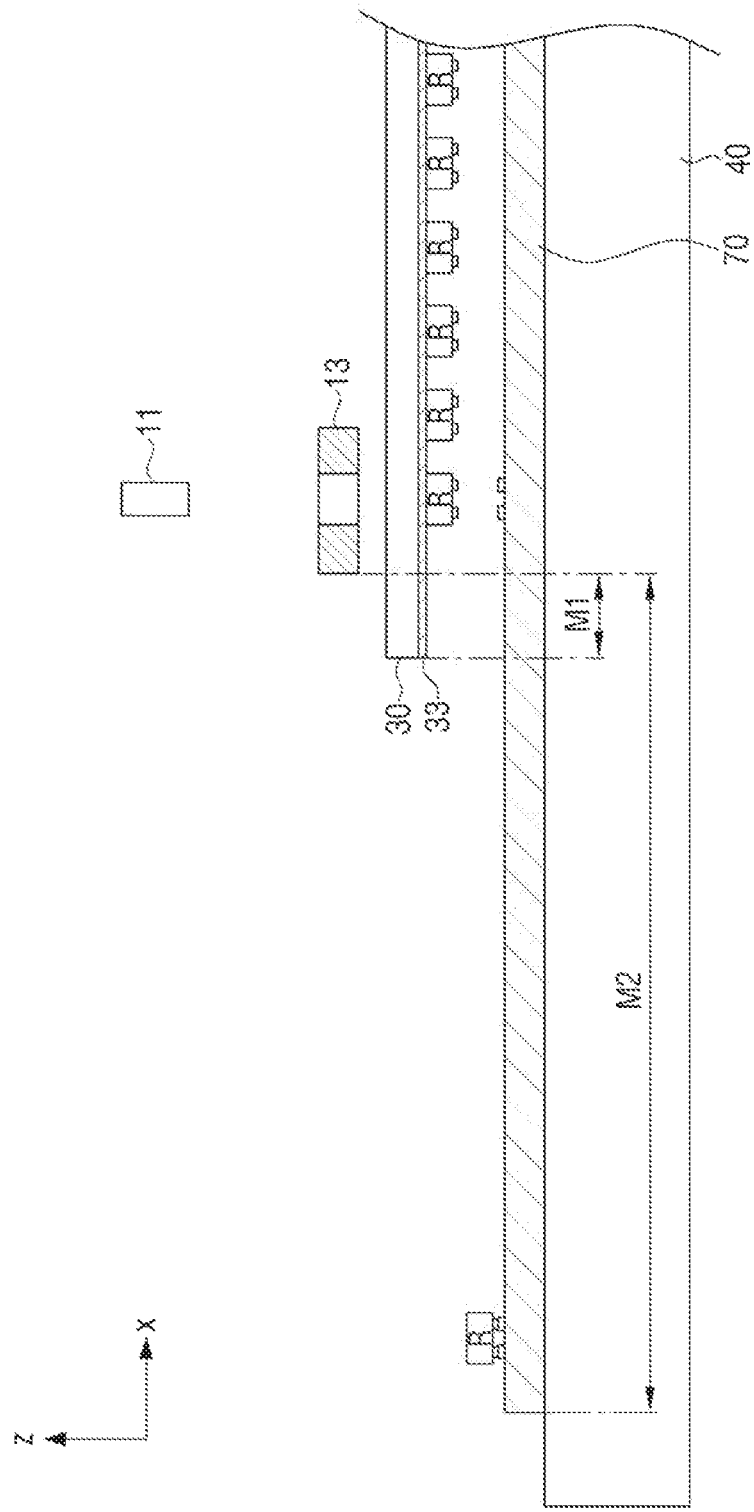

Referring to FIG. 14, in order to transfer other red, green, and blue LEDs of the relay substrate 30 onto the target substrate 70, the relay substrate 30 and the target substrate 70 move asynchronously with respect to each other by the respective stages (operation S13).

Specifically, the relay substrate 30 moves in the X-axis direction by a first movement distance (M1) such that a plurality of LEDs in the next column of the relay substrate 30 to be transferred onto the target substrate 70 are set to positions corresponding to each of the plurality of openings 13a of the mask 13 (or a position corresponding to the laser oscillator 11).

In addition, the target substrate 70 moves by a second movement distance (M2) such that positions in which a plurality of LEDs in the next column of the relay substrate 30 are to be disposed are set to positions corresponding to each of the plurality of openings 13a of the mask 13 (or positions corresponding to the laser oscillator 11). Referring to FIG. 15, the second movement distance (M2) may be greater than the first movement distance (M1).

As described above, as the relay substrate 30 and the target substrate 70 move asynchronously, the relay substrate 30 and the target substrate 70 may move to the positions in which the plurality of LEDs of the next column are to be transferred. In this state, the laser beam is radiated to a predetermined point toward the relay substrate 30 (operation S14). Accordingly, the plurality of red, green, and blue LEDs of the next column are separated from the relay substrate 30 and transferred onto the target substrate 70.

Figure 16:
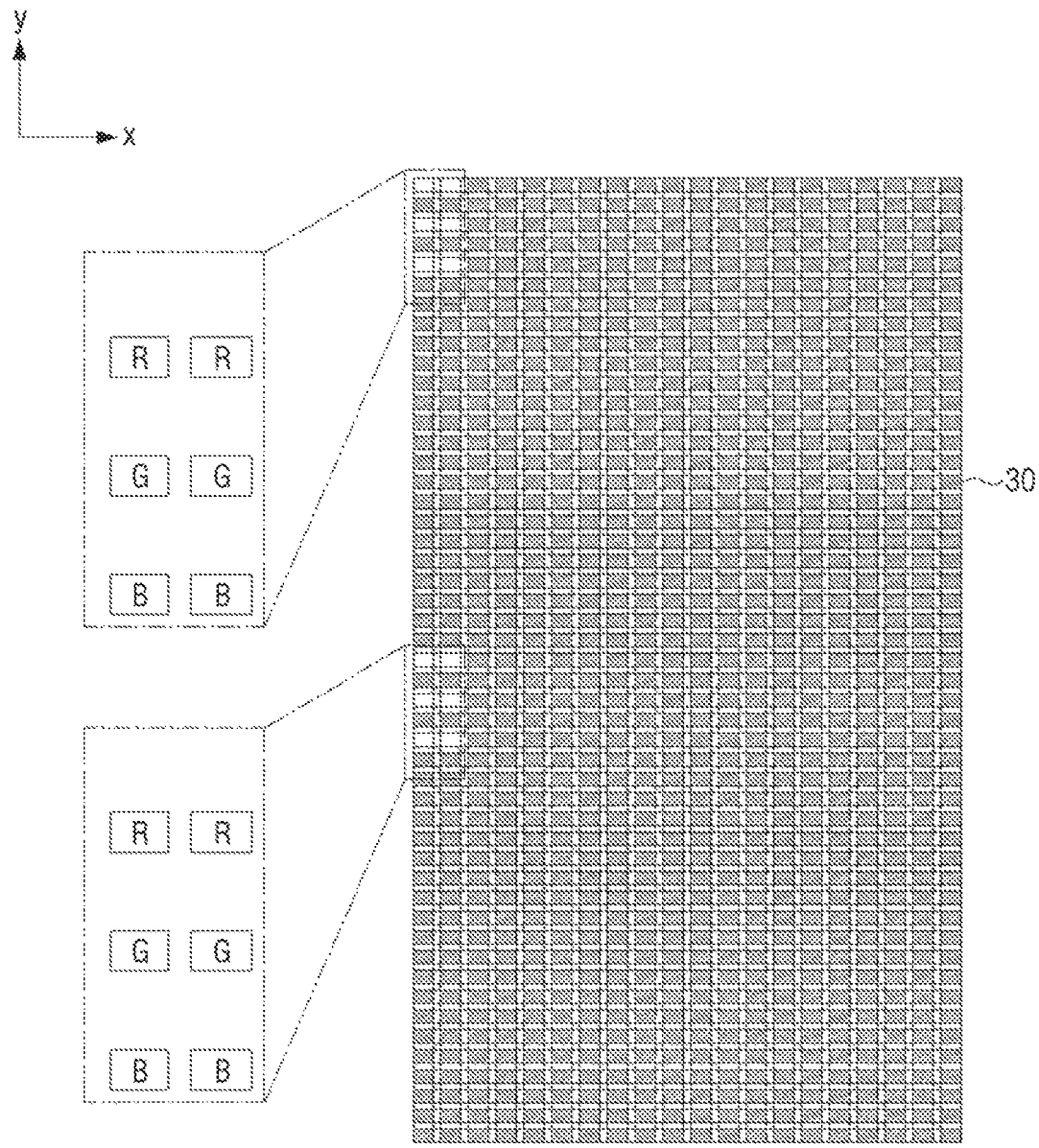

FIG. 16 illustrates the relay substrate 30 in a state in which the plurality of predetermined red, green, and blue LEDs of the second column are separated according to an embodiment.

The processor 50 determines whether the transfer is completed based on whether the plurality of red, green, and blue LEDs have been transferred to all predetermined positions of the target substrate 70 after the relay substrate 30 and the target substrate 70 move asynchronously and the laser beam is radiated (operation S15). If the transfer is not completed (operation S15—NO), then operations S13-S15 are repeated, and if the transfer is completed (operation S15—YES), then the transfer process for the target substrate 70 ends.

The transfer process according to an embodiment of described above may include a bonding process for stably mounting the plurality of LEDs of the relay substrate 30 on the target substrate 70. Hereinafter, a transfer process according to embodiments of the disclosure to which the bonding process is added will be described.

Figure 17:
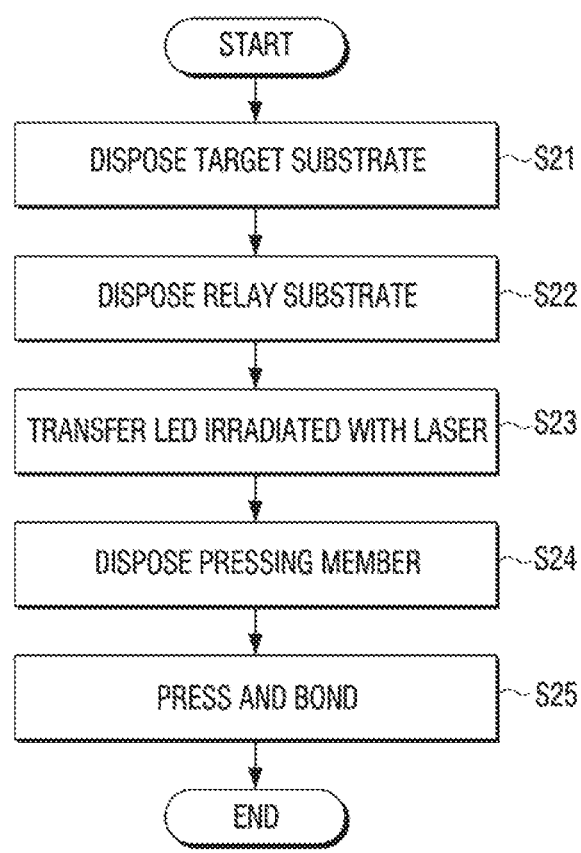
FIG. 17 is a flowchart illustrating a transferring method according to an embodiment.

FIG. 17 is a flowchart illustrating a transferring method according to an embodiment, and FIGS. 18A to 18D are diagrams illustrating a process of transferring a plurality of LEDs from a relay substrate to a target substrate according to the embodiment shown in FIG. 17.

The transfer process shown in FIG. 17 may correspond to a case in which a plurality of LEDs of a relay substrate 130 are mounted in a 1:1 correspondence on a target substrate 170. That is, the number of the plurality of LEDs on the relay substrate 130 and the number of positions at which the LEDs are to be mounted on the target substrate 170 are the same.

Figure 18A:
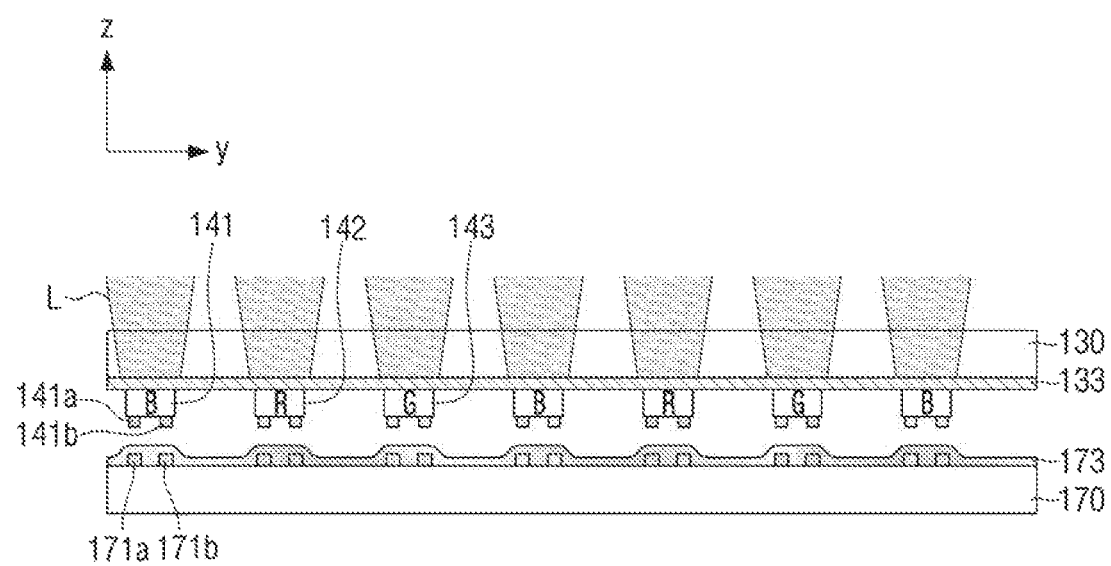
FIGS. 18A to 18D are diagrams sequentially illustrating a process of transferring a plurality of LEDs from a relay substrate to a target substrate according to the embodiment shown in FIG. 17.

Referring to FIG. 18A, the target substrate 170 is disposed at a predetermined position in a fixed state on a first stage in a state in which a surface (hereinafter referred to as "top surface of the target substrate 170") onto which a plurality of red, green, and blue LEDs are to be transferred is directed toward a laser oscillator (operation S21).

Here, the predetermined position may be a transfer position. In addition, the laser oscillator and the first stage may be the laser oscillator 11 and the stage 40 illustrated in FIG. 11, respectively.

On the top surface of the target substrate 170, a plurality of connection terminals 171a and 171b may be arranged at regular intervals, and an adhesive layer 173 covering the plurality of connection terminals 171a and 171b may be formed.

The plurality of connection terminals 171a and 171b may be components included in a pixel circuit provided in the TFT layer. In addition, the pixel circuit is provided on the TFT layer, and a glass substrate may be stacked on a lower side of the TFT layer. Therefore, the target substrate 170 may be formed in a form in which the TFT layer and the glass substrate are stacked.

The adhesive layer 173 may be formed to cover the entire top surface of the target substrate 170. In this case, the adhesive layer 173 may be formed in a form of a thin film or may be formed in a form applied by a dispenser. In this case, a portion of the adhesive layer 173 covering the plurality of connection terminals 171a and 171b may more protrude to a predetermined height that is greater than a portion of the adhesive layer 173 without the connection terminal as shown in FIG. 18A. In the case in which the entire top surface of the target substrate 170 is covered with the adhesive layer 173 of the same thickness, the portion of the adhesive layer 173 covering the connection terminals 171a and 171b may protrude more than the portion without the connection terminal due to the height of the connection terminals 171a and 171b.

In addition, the adhesive layer 173 may be formed in a predetermined pattern shape on the top surface of the target substrate 170. In this case, the adhesive layer 173 may be patterned to cover only the plurality of connection terminals 171a and 171b.

Various acrylic-based materials may be used as an adhesive component of the adhesive layer 173. For example, a transparent organic film (e.g., a transparent organic film material used in the manufacturing process of an existing LCD panel) or an opaque organic film (e.g., a Black Matrix) or polyimide (PI) may be used.

The relay substrate 130 is disposed such that a plurality of red, green, and blue LEDs 141, 142, and 143 are directed toward the target substrate 70. The relay substrate 130 may be detachably fixed to a second stage different from the first stage to which the target substrate 170 is fixed.

The second stage is disposed to be movable along the X and Y axes. Accordingly, the relay substrate 130 fixed to the second stage may be moved to a desired point along the X-Y plane.

The relay substrate 130 has an adhesive layer 133 formed on one surface thereof. The adhesive layer 133 may be referred to as a "dynamic release layer" (DRL), and may be formed of a polyimide (PI) material to facilitate separation upon transferring the plurality of LEDs of the relay substrate 130 onto the target substrate 170 using the LLO method.

As described above, in the state in which the top surface of the target substrate 170 is disposed toward the laser oscillator, the relay substrate 130 is disposed above the target substrate 170 by the second stage (operation S22). In this case, the relay substrate 130 is disposed such that a surface on which the plurality of LEDs 141, 142, and 143 are mounted faces the top surface of the target substrate 170.

In this state, the laser beam is radiated to a predetermined position with respect to the relay substrate 130. The adhesive layer 133 of the relay substrate 130 irradiated with the laser beam reacts to the laser beam, and the plurality of LEDs 141, 142, and 143 corresponding to the position irradiated with the laser beam are separated from the relay substrate 130 and then transferred onto the target substrate 170 (operation S23).

Figure 18B:
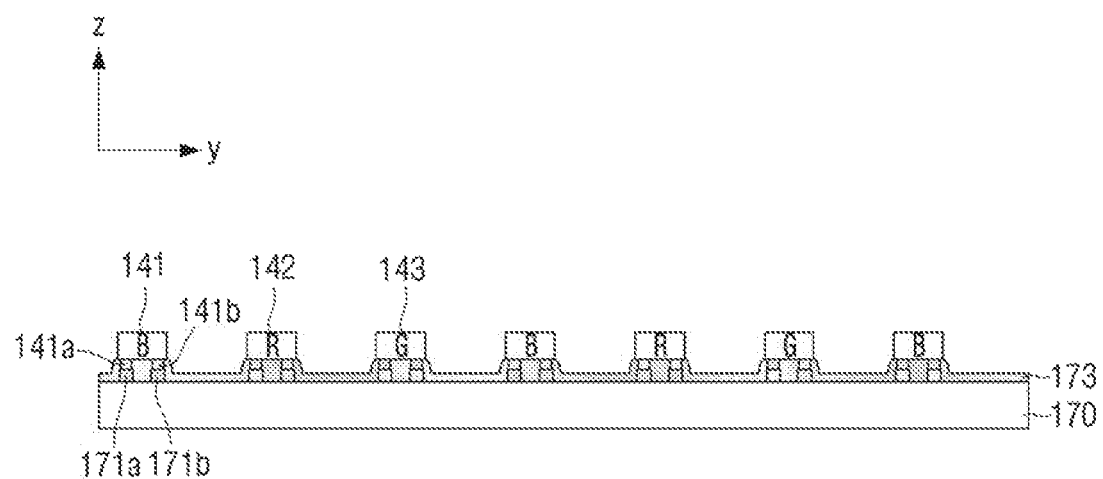
Figure 18C:
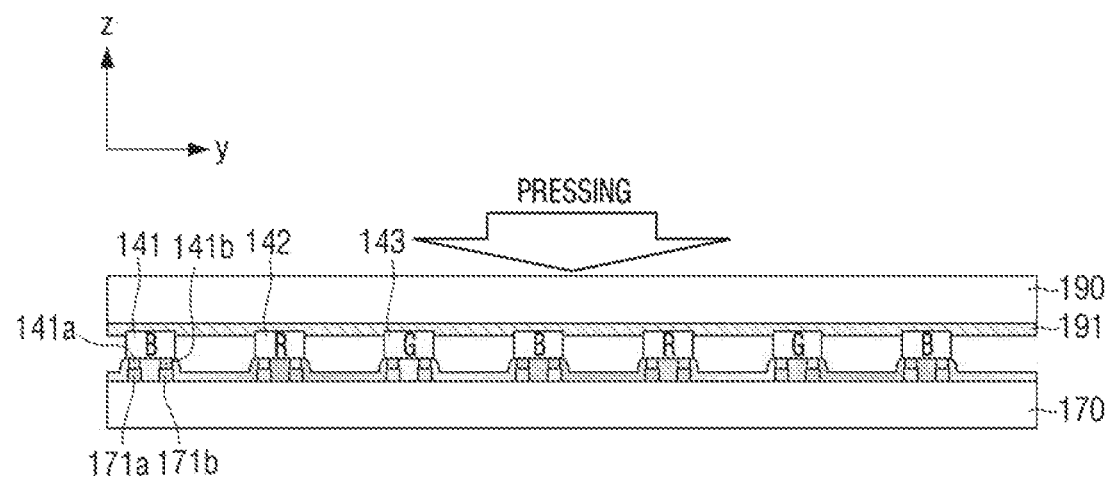
Figure 18D:
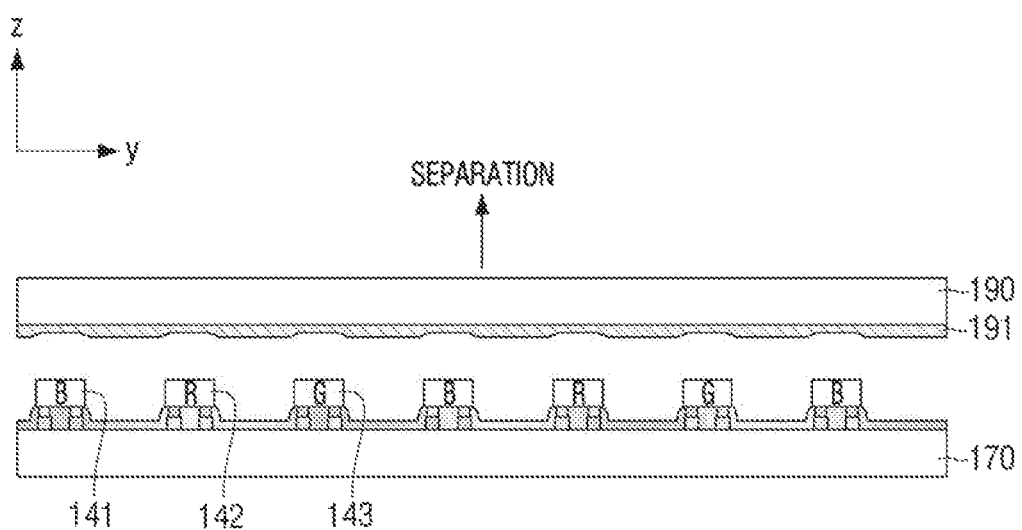

Referring to FIG. 18B, the plurality of LEDs 141, 142, and 143 transferred onto the target substrate 170 may be seated on top of a plurality of connection terminals 171a and 171b of the target substrate 170 to which an anode 141a and a cathode 141b correspond.

If the transfer process is completed, the second stage is driven to move the relay substrate 130 to a position deviating from an upper side of the target substrate 170. In order to perform a bonding process, a pressing member 190 is moved to a predetermined position above the target substrate 170 (operation S24). In this case, the pressing member 190 may be movably driven in the X, Y, and Z axes.

The pressing member 190 is formed of quartz or transparent glass, and a buffer layer 191 may be formed on one surface facing the target substrate 170. The buffer layer 191 has elasticity capable of protecting the plurality of LEDs 141, 142, and 143 from being damaged when the plurality of LEDs 141, 142, and 143 transferred onto the target substrate 170 are simultaneously pressed with the pressing member 190 in a downward direction of the target substrate 170.

The blue LED 141, the red LED 142, and the green LED 143 transferred onto the target substrate 170 may be formed in different thicknesses for each color, and a height of the position in which the LEDs for each color are mounted on the TFT layer may be differently formed. For this reason, a step may be caused between the blue LED 141, the red LED 142, and the green LED 143 transferred onto the target substrate 170. As described above, in the case in which the plurality of transferred LEDs 141, 142, and 143 have a step between LEDs of different colors, when simultaneously pressing the plurality of LEDs for bonding by the pressing member 190, it may be difficult to press each LED 141, 142, and 143 at a uniform pressure due to the step. In order to solve such a problem, the buffer layer 191 may be formed to an appropriate thickness to press each LED 141, 142, and 143 at a uniform pressure through the pressing member 190 to overcome the problem caused by the step.

If the plurality of LEDs 141, 142, and 143 are pressed for several seconds at a predetermined pressure by the pressing member 190, each of the electrodes 141a and 141b of the plurality of LEDs 141, 142, and 143 may be firmly bonded to the plurality of connection terminals 171a and 171b of the TFT layer through the adhesive layer 173 (operation S25).

If the bonding through the pressing member is completed, the pressing member 190 is separated from the target substrate and moved to a position deviating from the upper side of the target substrate 170.

Figure 19:
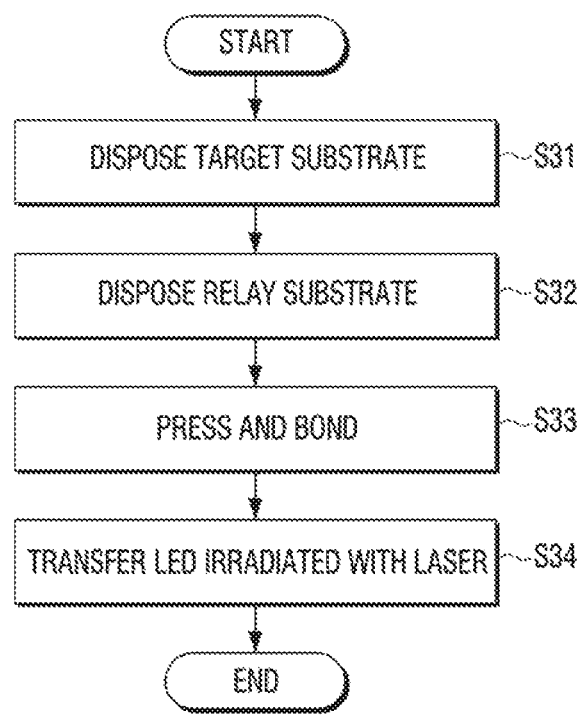
FIG. 19 is a flowchart illustrating a transferring method according to an embodiment.

Alternatively, instead of a method of pressing the plurality of LEDs 141, 142, and 143 with the pressing member 190, the bonding process may also be performed using a thermal bonding method by heating the target substrate 170 to a predetermined temperature using a heater or radiating an infrared (IR) laser to the target substrate 170. FIG. 19 is a flowchart illustrating a transferring method according to an embodiment, and FIGS. 20A to 20D are diagrams sequentially illustrating a process of transferring a plurality of LEDs from the relay substrate to the target substrate according to the embodiment shown in FIG. 19.

Figure 20A:
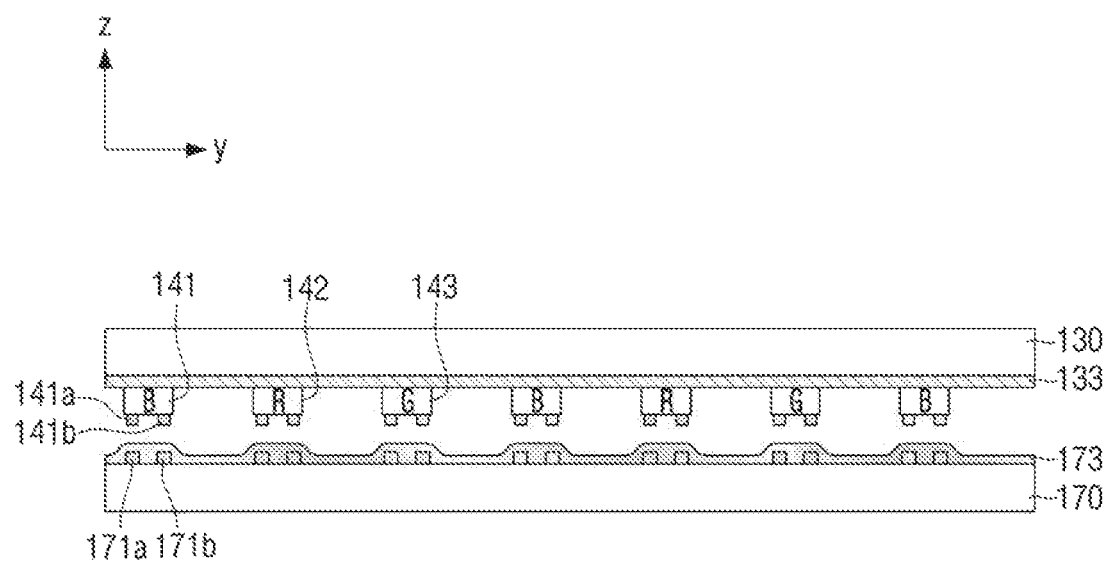
FIGS. 20A to 20D are diagrams sequentially illustrating a process of transferring a plurality of LEDs from a relay substrate to a target substrate according to the embodiment shown in FIG. 19.

Referring to FIG. 20A, the target substrate 170 is disposed at a predetermined position in a state fixed to a first stage in a state in which the top surface of the target substrate 170 is directed toward a laser oscillator (operation S31).

The relay substrate 130 is disposed such that the plurality of red, green, and blue LEDs 141, 142, and 143 are directed toward the target substrate 170 (operation S32). In this case, the relay substrate 130 is disposed at a position corresponding to each of the connection terminals 171a and 171b of the target substrate 170 onto which each of the electrodes 141a and 141b of the plurality of LEDs are to be transferred.

Figure 20B:
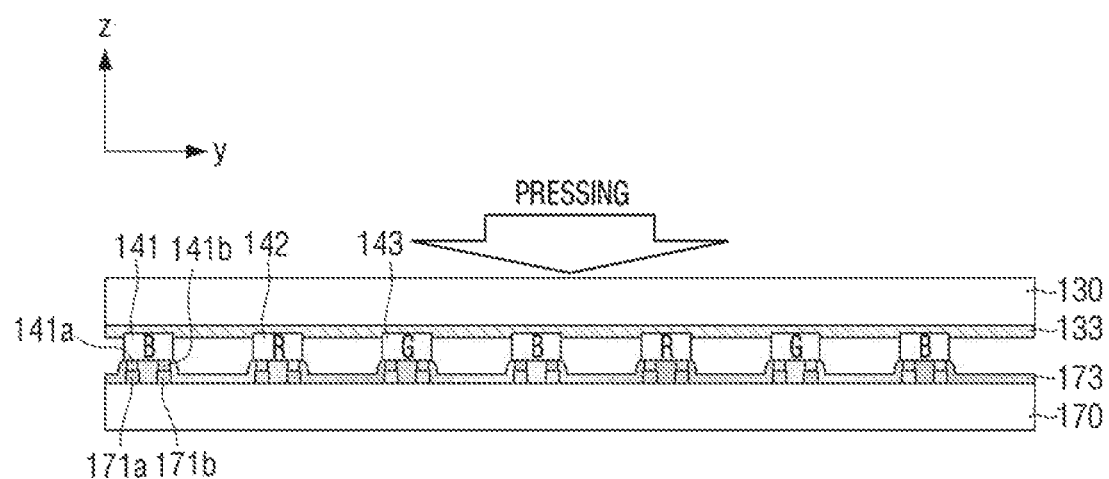

Referring to FIG. 20B, in order to perform a bonding process, the relay substrate 130 is moved toward the target substrate 170 to press the relay substrate 130 against the target substrate 170 at a predetermined pressure for a predetermined time frame (e.g., several seconds) (operation S33).

In this case, each of the electrodes 141a and 141b of the plurality of LEDs of the relay substrate 130 may be firmly bonded to the plurality of connection terminals 171a and 171b of the TFT layer through the adhesive layer 173.

Figure 20C:
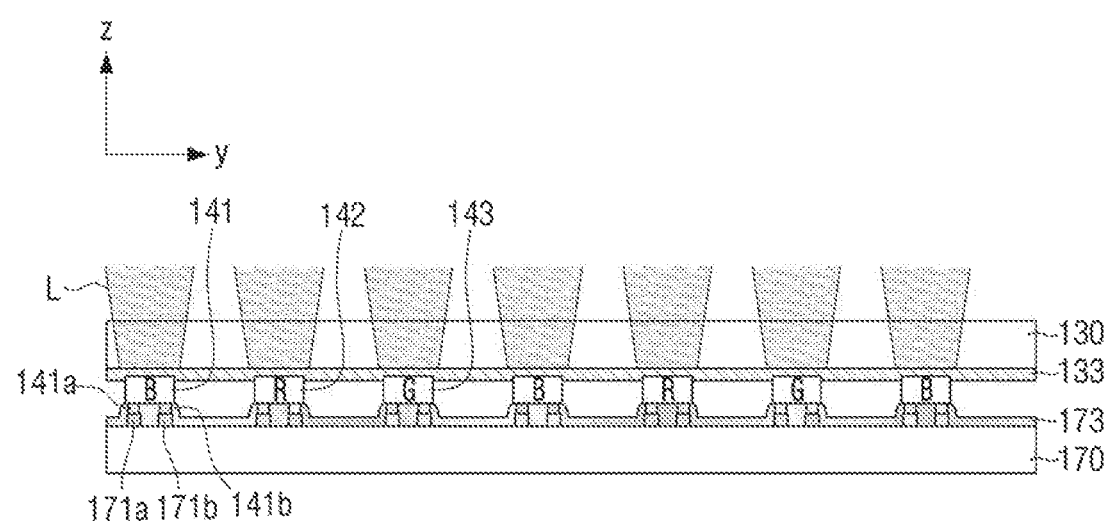

Referring to FIG. 20C, in this state, the laser beam is radiated to a predetermined position with respect to the relay substrate 130. The adhesive layer 133 of the relay substrate 130 irradiated with the laser beam reacts to the laser beam, and the plurality of LEDs 141, 142, and 143 corresponding to the positions irradiated with the laser beam are separated from the relay substrate 130 and then transferred onto the target substrate 170 (operation S34).

Figure 20D:
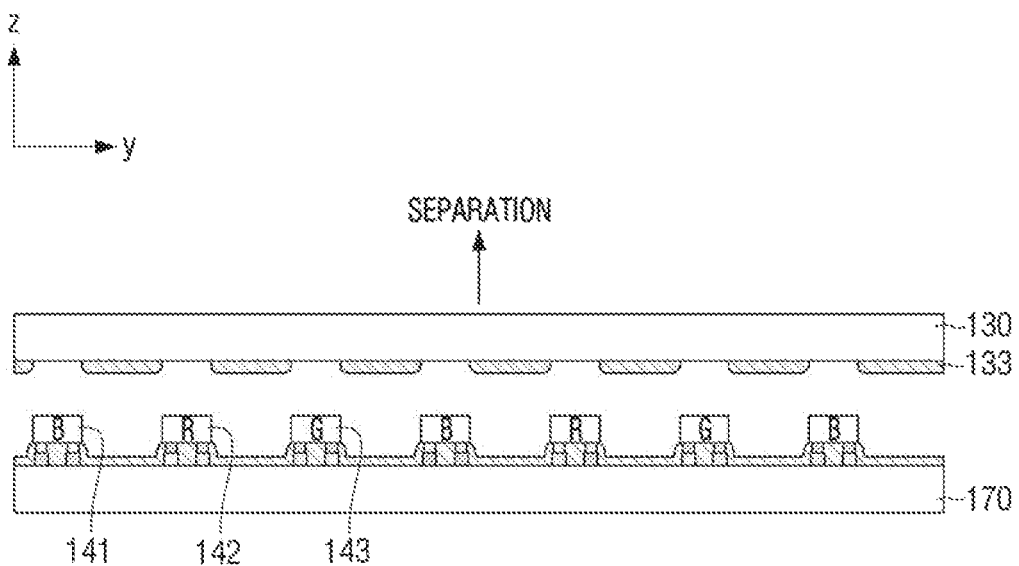

Referring to FIG. 20D, after the transfer is completed, the relay substrate 130 is separated from the upper side of the target substrate 170.

The embodiments including the above-described bonding process may correspond to a case in which the plurality of LEDs of the relay substrate 130 are mounted in a 1:1 correspondence on the target substrate 170.

Embodiments in which the bonding process described below is included may correspond to a case in which a plurality of LEDs 241, 241', 242, 242', 243, and 243' of a relay substrate 230 are mounted in an n:1 correspondence on a target substrate 270. That is, the number of the plurality of LEDs 241, 241', 242, 242', 243, and 243' on the relay substrate 230 is greater than the number of positions at which the LEDs 241, 241', 242, 242', 243, and 243' are to be mounted on the target substrate 270.

Figure 21:
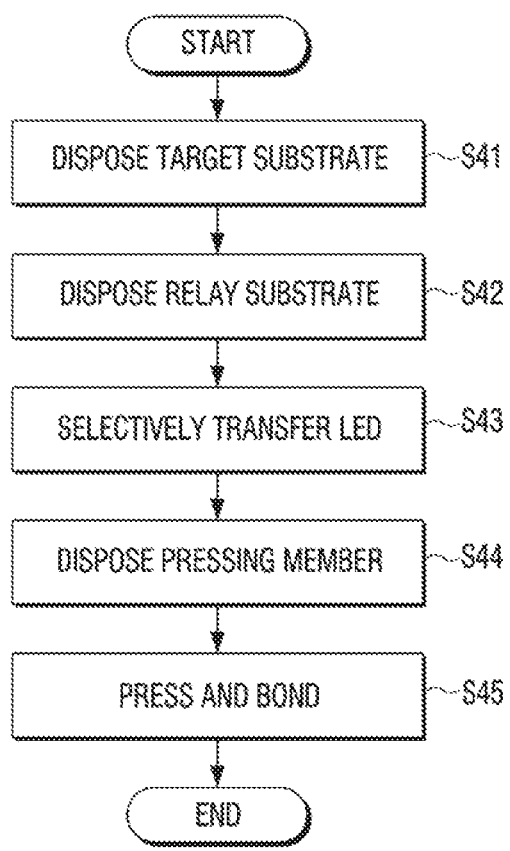
FIG. 21 is a flowchart illustrating a transferring method according to an embodiment.

FIG. 21 is a flowchart illustrating a transferring method according to an embodiment, and FIGS. 22A to 22D are diagrams sequentially illustrating a process of transferring a plurality of LEDs from the relay substrate to the target substrate according to the embodiment shown in FIG. 21.

Figure 22A:
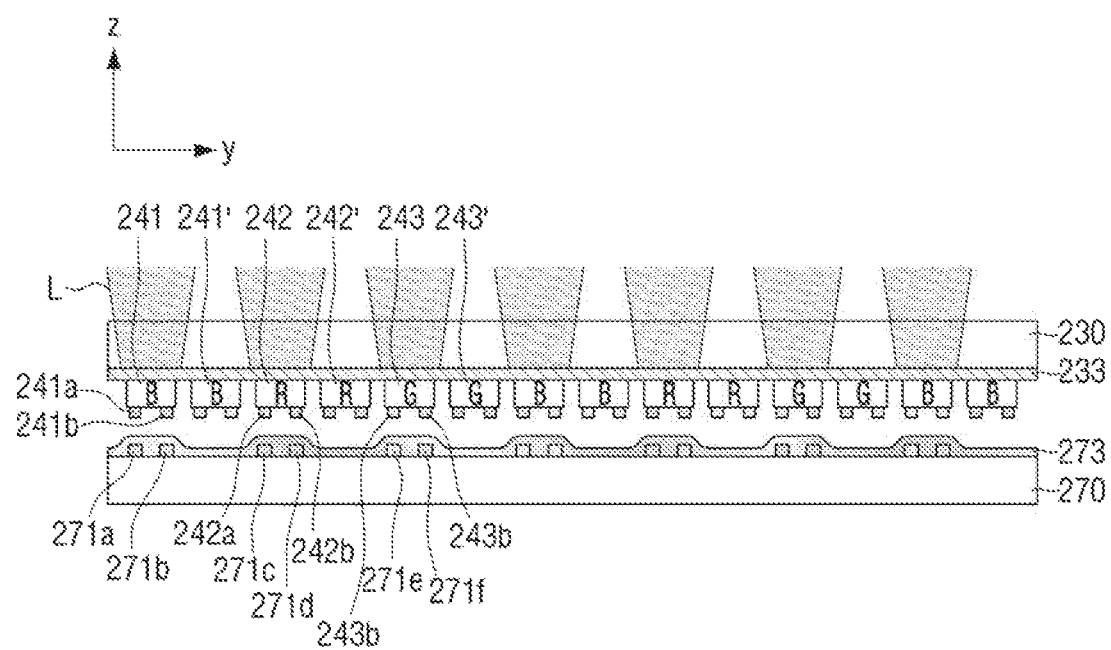
FIGS. 22A to 22D are diagrams sequentially illustrating a process of transferring a plurality of LEDs from a relay substrate to a target substrate according to the embodiment shown in FIG. 21.

From among a plurality of LEDs 241, 241', 242, 242', 243, and 243' of the relay substrate 230, two LEDs having the same color may be sequentially arranged as shown in FIG. 22A, and the number of connection terminals 271a, 271b, 271c, 271d, 271e, and 271f of the target substrate 270 may be formed to be smaller than the number of the plurality of LEDs 241, 241', 242, 242', 243, and 243' of the relay substrate 230. However, an arrangement of the plurality of LEDs 241, 241', 242, 242', 243, and 243' of the relay substrate 230 is not limited to the arrangement as shown in FIG. 22A.

Referring to FIG. 22A, the target substrate 270 is disposed at a predetermined position in a state fixed to a first stage in a state in which a top surface of the target substrate 270 is directed toward a laser oscillator (operation S41).

The relay substrate 230 is disposed such that the plurality of red, green, and blue LEDs 241, 242, and 243 are directed toward the target substrate 270 (operation S42). In this case, the relay substrate 230 is disposed at a position at which positions of each of the connection terminals 271a, 271b, 271c, 271d, 271e, and 271f of the target substrate 270 correspond to each of the electrodes 241a, 241b, 242a, 242b, 243a, and 243b of the plurality of LEDs 241, 241', 242, 242', 243, and 243'.

In this state, the laser beam is radiated to a predetermined position with respect to the relay substrate 230.

Figure 22B:
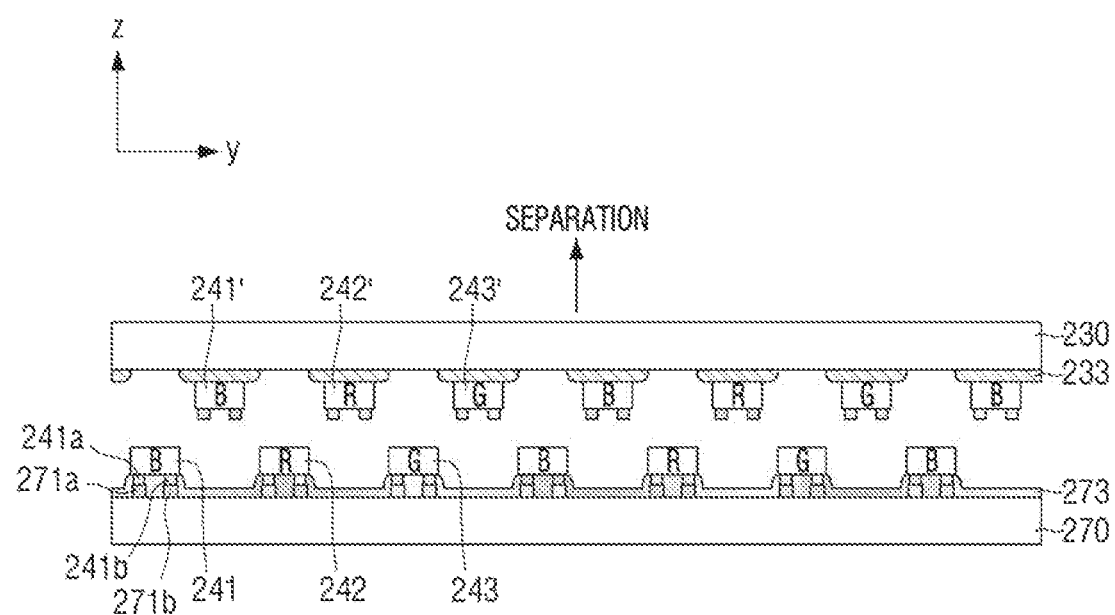

Accordingly, an adhesive layer 233 of the relay substrate 230 irradiated with the laser beam reacts to the laser beam as illustrated in FIG. 22B, and the plurality of LEDs 241, 241', 242, 242', 243, and 243' corresponding to the positions irradiated with the laser beam are separated from the relay substrate 230 and then transferred onto the target substrate 270 (operation S43).

The relay substrate 230 moves to a position deviating from the upper side of the target substrate 270 with the remaining LEDs not being transferred.

Figure 22C:
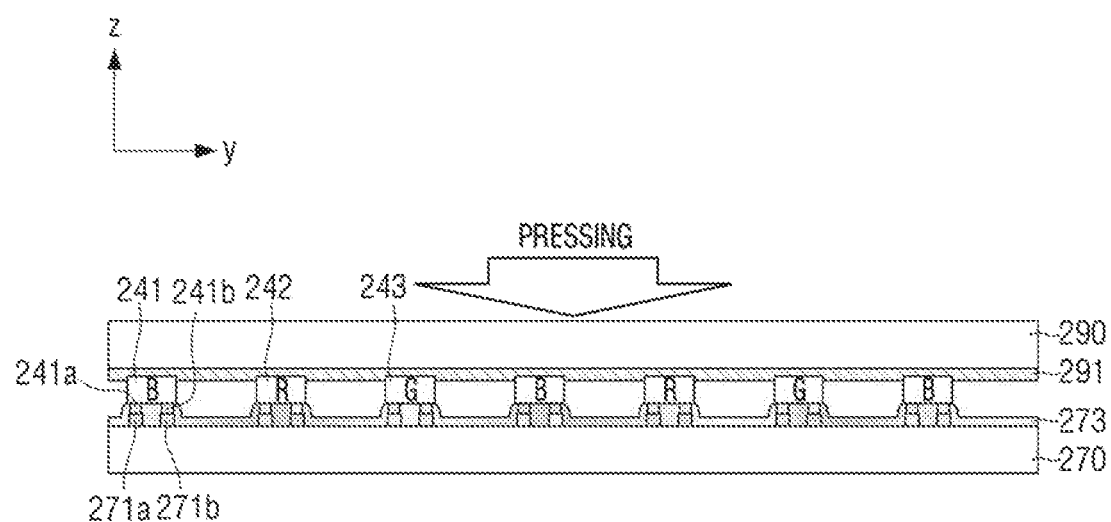

Referring to FIG. 22C, in order to perform a bonding process, a pressing member 290 is moved to a predetermined position above the target substrate 270 (operation S44). In this case, the pressing member 290 may be movably driven in the X, Y, and Z axes.

If the plurality of LEDs 241, 241', 242, 242', 243, and 243' are pressed for a predetermined time frame (e.g., several seconds) at a predetermined pressure by the pressing member 290, each of the electrodes 241a, 241b, 242a, 242b, 243a, and 243b of the plurality of LEDs 241, 242, and 243 may be firmly bonded to the plurality of connection terminals 271a, 271b, 271c, 271d, 271e, and 271f of the TFT layer through the adhesive layer 273 (operation S45).

Figure 22D:
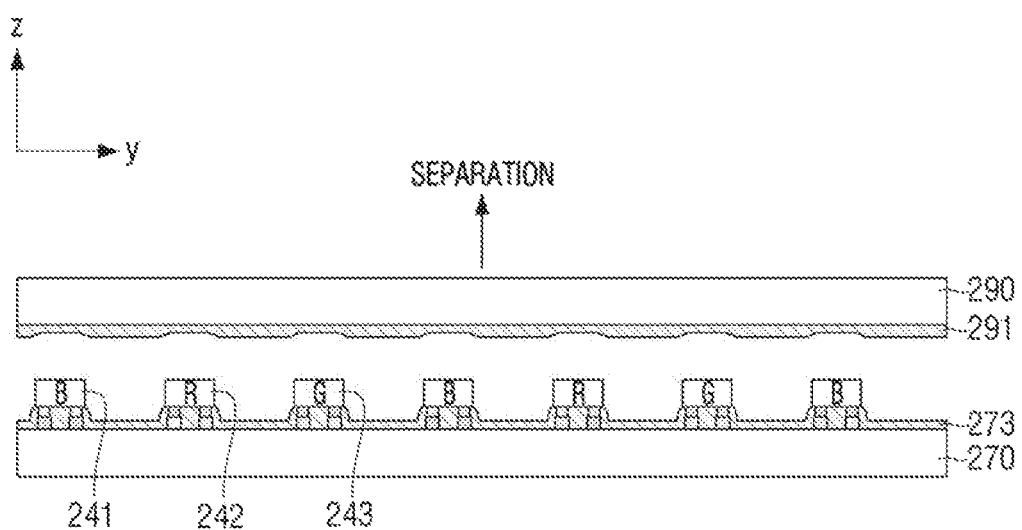

Referring to FIG. 22D, if the bonding through the pressing member is completed, the pressing member 290 is separated from the target substrate 270 and moved to a position deviating from the upper side of the target substrate 270.

Alternatively, instead of pressing the plurality of LEDs 241, 242, and 243 with the pressing member 290, a bonding process using heat may also be performed by heating the target substrate 270 to a predetermined temperature using a heater or radiating an IR laser to the target substrate 270.

Figure 23:
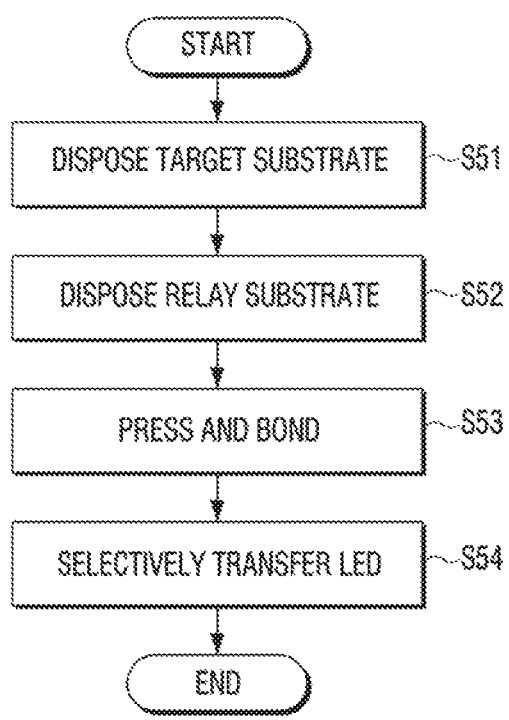
FIG. 23 is a flowchart illustrating a transferring method according to an embodiment.

FIG. 23 is a flowchart illustrating a transferring method according to an embodiment, and FIGS. 24A to 24D are diagrams sequentially illustrating a process of transferring a plurality of LEDs from the relay substrate to the target substrate according to the embodiment shown in FIG. 23.

Figure 24A:
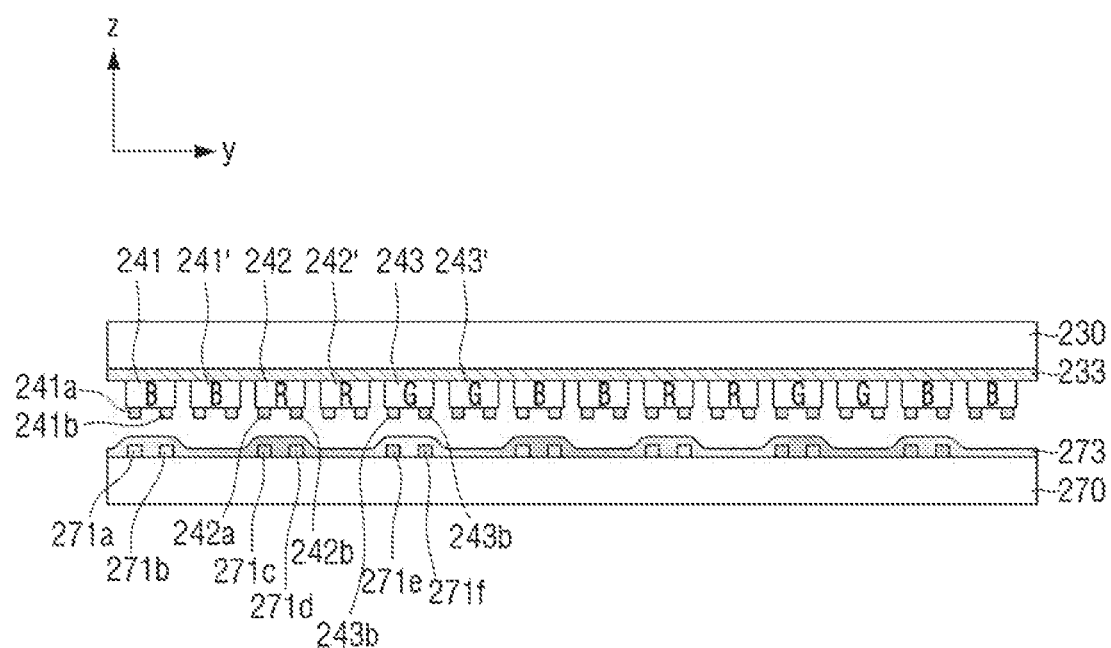
FIGS. 24A to 24D are diagrams sequentially illustrating a process of transferring a plurality of LEDs from a relay substrate to a target substrate according to the transferring method of the embodiment shown in FIG. 23.

Referring to FIG. 24A, the target substrate 270 is disposed at a predetermined position in a state fixed to a first stage in a state in which a top surface of the target substrate 270 is directed toward a laser oscillator (operation S51).

The relay substrate 230 is disposed such that a plurality of red, green, and blue LEDs 241, 241', 242, 242', 243, and 243' are directed toward the target substrate 270 (operation S52). In this case, the relay substrate 230 is disposed at a position corresponding to each of the connection terminals 271a, 271b, 271c, 271d, 271e, and 271f of the target substrate 270 onto which each of the electrodes 241a, 241b, 242a, 242b, 243a, and 243b of the plurality of LEDs is to be transferred.

Figure 24B:
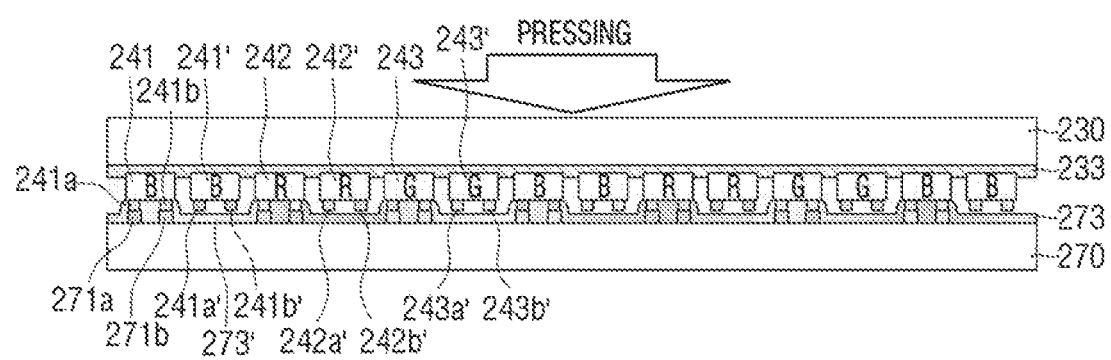

Referring to FIG. 24B, in order to perform a bonding process, the relay substrate 230 is moved toward the target substrate 270 to press the relay substrate 230 at a predetermined pressure for a predetermined time frame (e.g., several seconds) (operation S53).

In this case, each of the electrodes 241a, 241b, 242a, 242b, 243a, and 243b of the plurality of LEDs 241, 242, and 243 of the relay substrate 230 may be firmly bonded to the plurality of connection terminals 271a, 271b, 271c, 271d, 271e, and 271f of the TFT layer through the adhesive layer 273.

The LEDs 241', 242', and 243', which are not transferred to the target substrate 270 while the pressing is performed, are maintained at a predetermined distance from the adhesive layer 273 so that each of the electrodes 241a', 241b', 242a', 242b', 243a', and 243b' is not attached to the adhesive layer 273 of the target substrate 270. To this end, the adhesive layer 273 may need to be formed to an appropriate thickness.

Figure 24C:
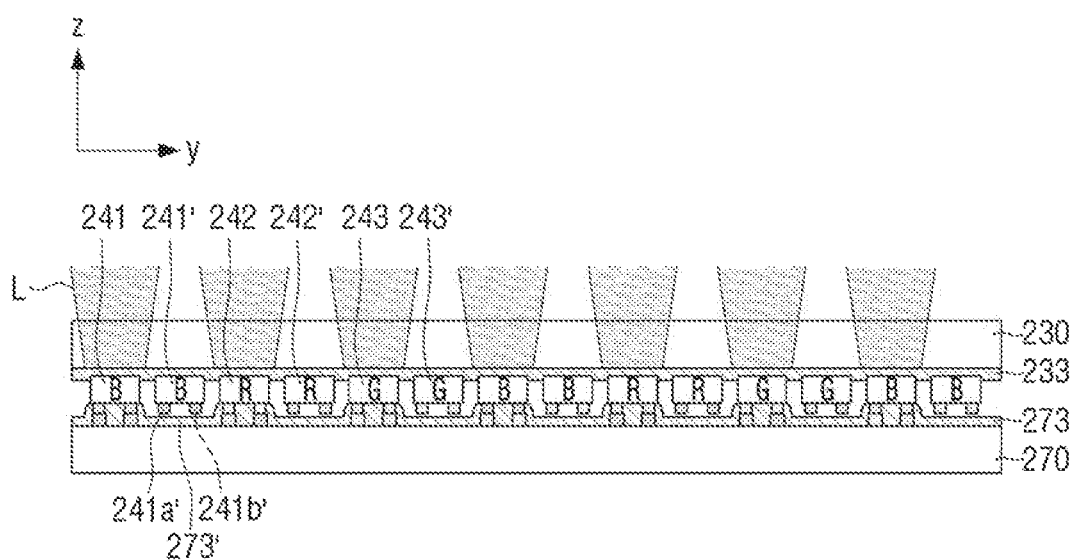

Referring to FIG. 24C, in this state, the laser beam is radiated to a predetermined position with respect to the relay substrate 230. An adhesive layer 233 of the relay substrate 230 irradiated with the laser beam reacts to the laser beam, and the plurality of LEDs 241, 242, and 243 corresponding to the positions irradiated with the laser beam are separated from the relay substrate 230 and then transferred onto the target substrate 270 (operation S54).

Figure 24D:
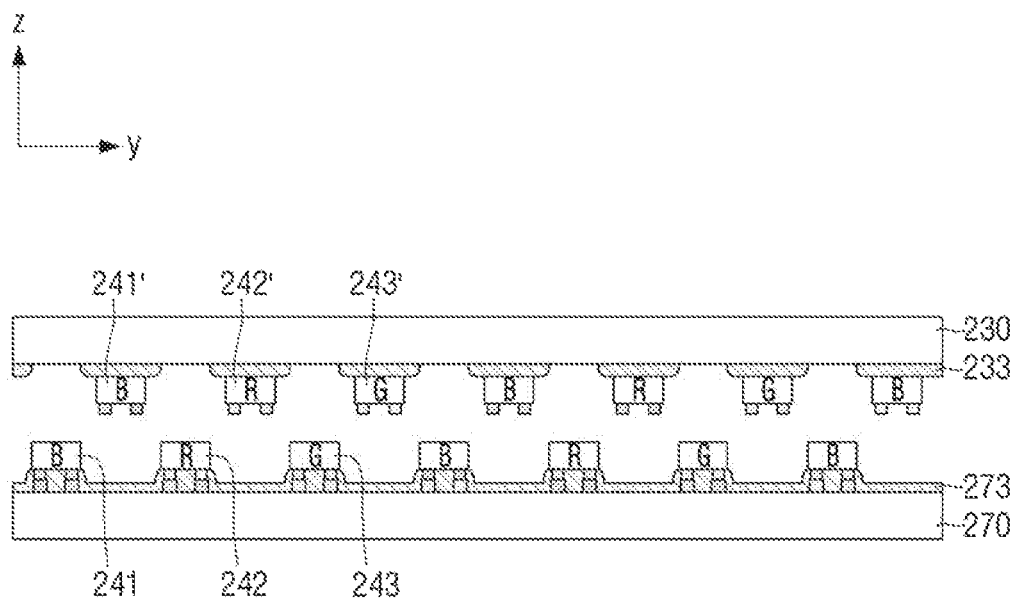

Referring to FIG. 24D, after the transfer is completed, the relay substrate 230 is separated from the upper side of the target substrate 270.

Alternatively, the methods according to the embodiments described above may be implemented in the form of an application installable on an existing LED transferring apparatus.

In addition, the methods according to the embodiments described above may be implemented by upgrading software or hardware of the existing LED transferring apparatus.

In addition, the embodiments described above may also be performed through an embedded server included in the LED transferring apparatus, or an external server of the LED transferring apparatus.

The embodiments described above may be implemented in a computer or a computer-readable medium using software, hardware, or a combination of software and hardware. In some cases, the embodiments described in the disclosure may be implemented by the processor 50 itself. According to a software implementation, the embodiments such as procedures and functions described in the disclosure may be implemented as separate software modules. Each of the software modules may perform one or more functions and operations described in the disclosure.

Computer instructions for performing processing operations of the LED transferring apparatus 1 according to the embodiments of the disclosure described above may be stored in a non-transitory computer-readable medium. The computer instructions stored in the non-transitory computer-readable medium allow a specific device to perform the processing operations of the LED transferring apparatus 1 according to the embodiments described above based on being executed by a processor of the specific device.

The non-transitory computer-readable medium is a machine-readable medium that semi-permanently stores data. A specific example of the non-transitory computer-readable medium may include a compact disk (CD), a digital versatile disk (DVD), a hard disk, a Blu-ray disk, a universal serial bus (USB), a memory card, a read only memory (ROM), or the like.

Although the embodiments have been individually described hereinabove, the respective embodiments are not necessarily implemented in a discrete manner, but the configurations and operations of each of the embodiments may be implemented in combination with at least one other embodiment.

Although the embodiments of the disclosure have been illustrated and described hereinabove, the disclosure is not limited to the above-mentioned specific embodiments, but may be variously modified by those skilled in the art to which the disclosure pertains without departing from the scope and spirit of the disclosure as claimed in the accompanying claims. Such modifications should not be individually understood from the technical spirit or the prospect of the disclosure.

What is claimed is:

1. A light-emitting diode (LED) transferring method comprising:
　　disposing a transfer substrate, on which a plurality of LEDs of different colors are sequentially arranged in at least a row or at least a column, between a target substrate and a laser oscillator; and
　　simultaneously transferring the plurality of LEDs from the transfer substrate to predetermined points of the target substrate by radiating a laser beam toward the target substrate from the laser oscillator, such that each of the plurality of LEDs is adjacent to at least one LED of a different color, wherein the plurality of LEDs are arranged in a plurality of rows on the transfer substrate; and wherein all LEDs in each respective row of the plurality of rows are a same color as each other and are a different color from LEDs in an adjacent row of the plurality of rows that is adjacent to the respective row.

2. The LED transferring method as claimed in claim 1, wherein in the transferring, the plurality of LEDs are formed as a group that is simultaneously transferred onto the target substrate.

3. The LED transferring method as claimed in claim 2, wherein in the transferring, a plurality of groups, including the group, are simultaneously transferred onto the target substrate at predetermined intervals.

4. The LED transferring method as claimed in claim 3, wherein the group includes a red LED, a green LED, and a blue LED.

5. The LED transferring method as claimed in claim 4, wherein the group further includes a white LED.

6. The LED transferring method as claimed in claim 1, further comprising:
moving the transfer substrate by a first movement distance;
moving the target substrate by a second movement distance different from the first movement distance; and
simultaneously transferring another plurality of LEDs of different colors from the transfer substrate to the target substrate.

7. The LED transferring method as claimed in claim 1, further comprising, after the transferring, bonding the plurality of LEDs to the target substrate by pressing the plurality of LEDs with a pressing member.

8. The LED transferring method as claimed in claim 7, wherein the pressing member presses the plurality of LEDs through a buffer layer formed on a surface facing the plurality of LEDs.

9. The LED transferring method as claimed in claim 1, further comprising, before the transferring, bonding a relay substrate by pressing the relay substrate toward the target substrate.

10. The LED transferring method as claimed in claim 1, further comprising, after the transferring, bonding the plurality of LEDs to the target substrate using a thermal bonding method.

11. The LED transferring method as claimed in claim 10, wherein the thermal bonding method comprises heating the target substrate with a heater, or heating the target substrate with an infrared laser.

12. A display module comprising:
a glass substrate; and
a plurality of light-emitting diodes (LEDs) of different colors, wherein the display module is manufactured by disposing a transfer substrate, on which the plurality of LEDs are sequentially arranged in at least a row or at least a column, between the glass substrate and a laser oscillator; and simultaneously transferring the plurality of LEDs from the transfer substrate to predetermined points of the glass substrate by radiating a laser beam toward the glass substrate from the laser oscillator, such that each of the plurality of LEDs is adjacent to at least one LED of a different color, wherein the plurality of LEDs are arranged in a plurality of rows on the transfer substrate; and wherein all LEDs in each respective row of the plurality of rows are a same color as each other and are a different color from LEDs in an adjacent row of the plurality of rows that is adjacent to the respective row.

13. The display module as claimed in claim 12, wherein the plurality of LEDs are formed as a group.

14. The display module as claimed in claim 13, wherein a plurality of groups, including the group, are transferred onto the glass substrate at predetermined intervals.

15. The display module as claimed in claim 13, wherein the group includes a red LED, a green LED, and a blue LED.

16. The display module as claimed in claim 15, wherein the red LED, the green LED, and the blue LED are sequentially arranged in the row or the column.

17. The display module as claimed in claim 13, wherein the group further includes at least an additional LED different in color from a red LED, a green LED, and a blue LED.

18. The display module as claimed in claim 17, wherein the additional LED is a white LED.

19. The display module as claimed in claim 18, wherein the red LED, the green LED, the blue LED, the white LED are sequentially arranged in the row or the column.

20. A non-transitory computer readable medium including a program for executing a light-emitting diode (LED) transferring method, the LED transferring method comprising:
disposing a transfer substrate, on which a plurality of LEDs of different colors are sequentially arranged in at least one row or at least one column, between a target substrate and a laser oscillator; and simultaneously transferring the plurality of LEDs from the transfer substrate to predetermined points of the target substrate by radiating a laser beam toward the target substrate from the laser oscillator, such that each of the plurality of LEDs is adjacent to at least one LED of a different color, wherein the plurality of LEDs are arranged in a plurality of rows on the transfer substrate; and wherein all LEDs in each respective row of the plurality of rows are a same color as each other and are a different color from LEDs in an adjacent row of the plurality of rows that is adjacent to the respective row.

* * * * *